(12) United States Patent
Kuroda

(10) Patent No.: US 8,558,393 B2
(45) Date of Patent: Oct. 15, 2013

(54) SEMICONDUCTOR DEVICE

(75) Inventor: Hiroshi Kuroda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/442,247

(22) Filed: Apr. 9, 2012

(65) Prior Publication Data

US 2012/0273970 A1 Nov. 1, 2012

(30) Foreign Application Priority Data

Apr. 28, 2011 (JP) ................................. 2011-100483

(51) Int. Cl.
*H01L 25/065* (2006.01)

(52) U.S. Cl.
USPC ..... 257/777; 257/723; 257/784; 257/E25.013

(58) Field of Classification Search
USPC ........................... 257/777, 723, 784, E25.013
See application file for complete search history.

(56) References Cited

U.S. PATENT DOCUMENTS 7,750,464 B2 7/2010 Yoshikawa et al.

FOREIGN PATENT DOCUMENTS

JP 2008-251917 A 10/2008

*Primary Examiner* — Long Pham
(74) *Attorney, Agent, or Firm* — Mattingly & Malur, PC

(57) ABSTRACT

Miniaturization and acceleration of the operating speed of a System In Package (SIP) type semiconductor device in which a memory chip and a microcomputer chip are mounted over a wiring board are promoted. When mounting a microcomputer chip and a memory chip over an upper surface of a wiring board, the memory chip is disposed such that second conductive pads of the wiring board arranged along a first chip side (a side along which data system electrode pads are arranged) of the memory chip are positioned, in the plan view, in a region between an extended line of a third chip side of the microcomputer chip and an extended line of a fourth chip side of the microcomputer chip. Thus, a length of a data system wiring for coupling a data system electrode pad of the microcomputer chip with the data system electrode pad of the memory chip is minimized.

10 Claims, 24 Drawing Sheets

SEMICONDUCTOR DEVICE

CROSS-REFERENCE TO RELATED APPLICATIONS

The disclosure of Japanese Patent Application No. 2011-100483 filed on Apr. 28, 2011 including the specification, drawings and abstract is incorporated herein by reference in its entirety.

BACKGROUND

The present invention relates to a semiconductor device. In particular, it relates to a technique effective to be applied to a System In Package (SIP) type semiconductor device in which a memory chip and a microcomputer chip are mounted over a wiring board.

Described in Patent Document 1 (Japanese Patent Laid-open No. 2008-251917), for example, is an SIP in which a memory chip and a microcomputer chip are mounted over a wiring board.

According to Patent Document 1, equalization of wirings between chips is promoted by providing the SIP as follows. That is, there are mounted, over a module board (wiring board), a plurality of stacked memory chips which a data-processor chip simultaneously accesses. Address system bonding pads of the data-processor chip are connected with address system bonding pads of the memory chip between the memory chips through common/address system wirings. Data system bonding pads of the data processor chip are connected to data system bonding pads of the memory chip through individual data system wirings. With respect to an arrangement of the data system bonding pads of the data processor chip, an arrangement of the data system bonding pads of the memory chip connected through the data system wirings is made such that memory chips are disposed in an alternating sequence.

SUMMARY

As in Patent Document 1 (see FIG. 5, in particular), the present inventors have examined an SIP type semiconductor device in which a memory chip and a data-processor chip (or a microcomputer chip) for controlling the memory chip are mounted over one substrate (wiring board).

In recent years, there have been demands for advanced features and acceleration of the operating speed of a semiconductor device. In order to meet these demands, in an SIP type semiconductor device also, the number of electrode pads (bonding pads) of each semiconductor chip (a microcomputer chip, a memory chip) tends to increase. Along with this tendency, the number of conductive pads (bonding leads) provided in a substrate keeps increasing. On the other hand, miniaturization and lighter weight of electronic apparatuses are called for. Therefore, the substrate and the semiconductor chips of the SIP type semiconductor device to be mounted in an electronic apparatus tend to be reduced in size.

Even when the number of electrode pads of the semiconductor chip (a microcomputer chip, a memory chip) increases, in order to prevent the size of the chip from increasing or the length of the conductive pad row of the substrate from increasing, it is effective not to arrange a plurality of electrode pads along one side only of the semiconductor chip but, for example, as described in Patent Document 1, to arrange the electrode pads along each of two facing sides of the memory chip.

However, if the electrode pads are arranged along the two opposing sides of the memory chip, conductive pads of the substrate electrically connected to these electrode pads through conductive members (wires, in this case) also have to be arranged along the above two sides of the memory chip.

Therefore, when the memory chip is mounted over the substrate, for example, as shown in FIG. 5 of Patent Document 1, if one of the two sides along which the electrode pads are arranged is so disposed as to face the microcomputer chip, the length of the wiring which electrically couples the electrode pad arranged along the other one of the two sides with the conductive pad of the microcomputer chip increases. As a result, an occupancy area of the wiring over the upper surface of the substrate increases, and the outer dimensions of the substrate increases that much.

As a result of this, it has become clear that, when using the substrate whose outer dimensions are small to meet the demand on miniaturization of an SIP type semiconductor device, it is difficult to adopt the chip-mounting method described above.

It is therefore an object of the present invention to provide a technique which can cope with miniaturization of an SIP type semiconductor device.

Another object of the present invention is to provide a technique which can cope with acceleration of the operating speed of an SIP type semiconductor device.

The above and other objects as well as a novel feature of the present invention will be apparent from the description of the present specification and the drawing attached thereto.

A brief summary of a typical example of the invention disclosed in the present application will be given as follows.

A semiconductor device according to a typical embodiment of the present invention includes: (a) a substrate; (b) a microcomputer chip; (c) a first memory chip; (d) a plurality of first wires; and (e) a plurality of second wires.

A planar shape of the substrate includes: an upper surface having a first substrate side, a second substrate side opposed to the first substrate side, a third substrate side disposed orthogonal to the first and second substrate sides, and a fourth substrate side facing to the third substrate side; a plurality of first conductive pads and a plurality of second conductive pads formed over the upper surface, a plurality of wirings which electrically couple the plurality of first conductive pads with the plurality of second conductive pads; and a lower surface on an opposite to the upper surface.

A planar shape of the microcomputer chip includes; a microcomputer surface having a first microcomputer chip side, a second microcomputer chip side facing to the first microcomputer side, a third microcomputer chip side disposed orthogonal to the first and second microcomputer chip sides, and a fourth microcomputer chip side facing to the third microcomputer chip side; a plurality of first microcomputer electrode pads formed over the microcomputer surface and arranged along the first, third, and fourth microcomputer chip sides, respectively; a plurality of second microcomputer electrode pads formed over the microcomputer surface and arranged along the second microcomputer chip side, and a microcomputer back surface on an opposite side of the microcomputer surface. The microcomputer back surface is facing to the substrate and each of the first and second conductive pads is exposed. In a plan view, the microcomputer chip is mounted over the upper surface of the substrate such that the first microcomputer chip side is adjacent to the first substrate side and the third microcomputer chip side is adjacent to the third substrate side.

A planar shape of the first memory chip includes: a first memory surface having a first memory chip side, a second memory chip side facing to the first memory chip side, a third memory chip side orthogonal to the first and second memory chip sides, and a fourth memory chip side facing to the third memory chip side; a plurality of first memory electrode pads formed over the first memory surface and arranged along the first memory chip side; a plurality of second memory electrode pads formed over the first memory surface and arranged along the second memory chip side; and a first memory back surface on the opposite side of the first memory surface. The first memory back surface is facing to the substrate and each of the first and second conductive pads is exposed. In the plan view, the first memory chip is mounted adjacent to the microcomputer chip such that the third memory chip side is adjacent to the first substrate side, the second memory chip side is adjacent to the third substrate side, a spacing between the third memory chip side and the first substrate side is smaller than a spacing between the first microcomputer chip side and the first substrate side, and a spacing between the second memory chip side and the third substrate side is smaller than a spacing between the third microcomputer chip side and the third substrate side.

The first wires electrically couple the plurality of first and second microcomputer electrode pads with the first conductive pads, respectively.

The second wires electrically couple the first and second memory electrode pads with the second conductive pads, respectively.

In the plan view, the first conductive pads are arranged along the first, second, third, and fourth microcomputer chip sides of the microcomputer chip, respectively. In the plan view, the second conductive pads are arranged along the first and second memory chip sides of the memory chip, respectively. Each of the first microcomputer electrode pads formed in the microcomputer chip and the first memory electrode pads formed in the first memory chip has a data system electrode pad. Each of the second microcomputer electrode pads formed in the microcomputer chip and the second memory electrode pads formed in the first memory chip has a command/address system electrode pad. The first data system conductive pads of the first conductive pads formed over the substrate electrically connected to the first microcomputer electrode pads of the microcomputer chip through the first wire are arranged along the first, third, and fourth microcomputer chip sides of the microcomputer chip, respectively. The second data system conductive pads of the second conductive pads formed over the substrate, electrically connected to the first memory electrode pads of the first memory chip through the second wire are arranged along the first memory chip side of the memory chip.

Advantages obtained by typical inventions in the inventions disclosed in the application are briefly described as follows.

The miniaturization of an SIP type semiconductor device can be promoted.

The acceleration of the operating speed of the SIP type semiconductor device can be promoted.

DETAILED DESCRIPTION

Figure 1:
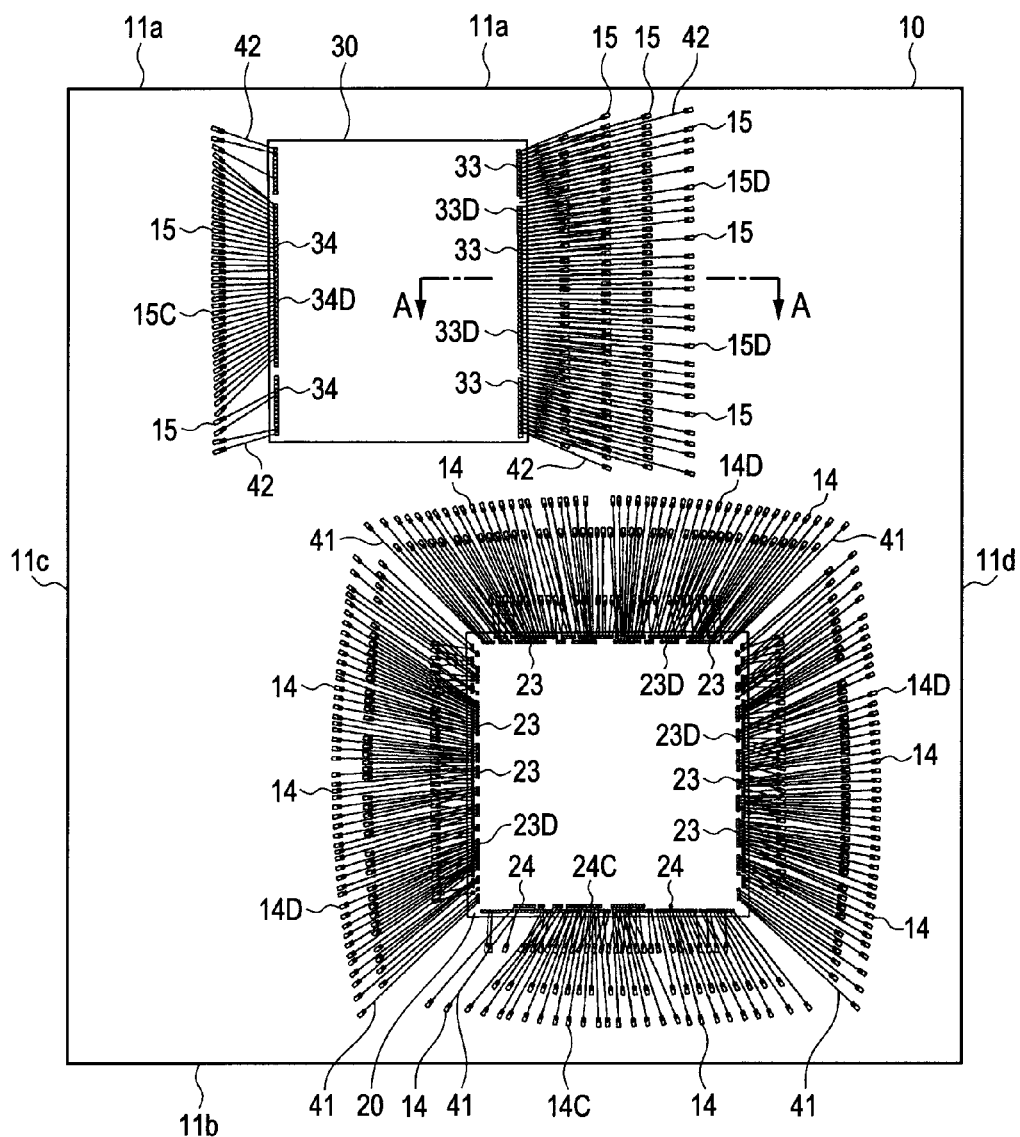
FIG. 1 is an overall plan view of a semiconductor device according to a first embodiment of the present invention.

Now, various embodiments of the invention will be described specifically based on the accompanying drawings. In all of the drawings for explaining the embodiments, members having a like function will be identified by like reference numerals, and overlapping descriptions thereof will be omitted. In the following description of the embodiments, a description of the same or similar portion is not repeated in principle unless otherwise particularly necessary. In the drawings used to illustrate the embodiments, even a plan view is sometimes hatched for facilitating an understanding of it.

On the other hand, hatching is sometimes omitted even from a cross-sectional view for facilitating an understanding of it.

In the embodiments below, a "paste material" means an adhesive having a fluid property. A "die attach film (DAF)" means a film-like adhesive serving also as a dicing tape. A data system electrode pad (DQ, DQS, pad for data strobe) means an electrode pad (bonding pad) provided over a surface of the memory chip for writing data to a memory circuit or reading data from the memory circuit. A command/address system electrode pad (CMD/ADD pad) means an electrode pad (bonding pad) provided over a surface of the memory chip for inputting and outputting signals which specify addresses in the memory circuit where data is stored.

First Embodiment

Figure 2:
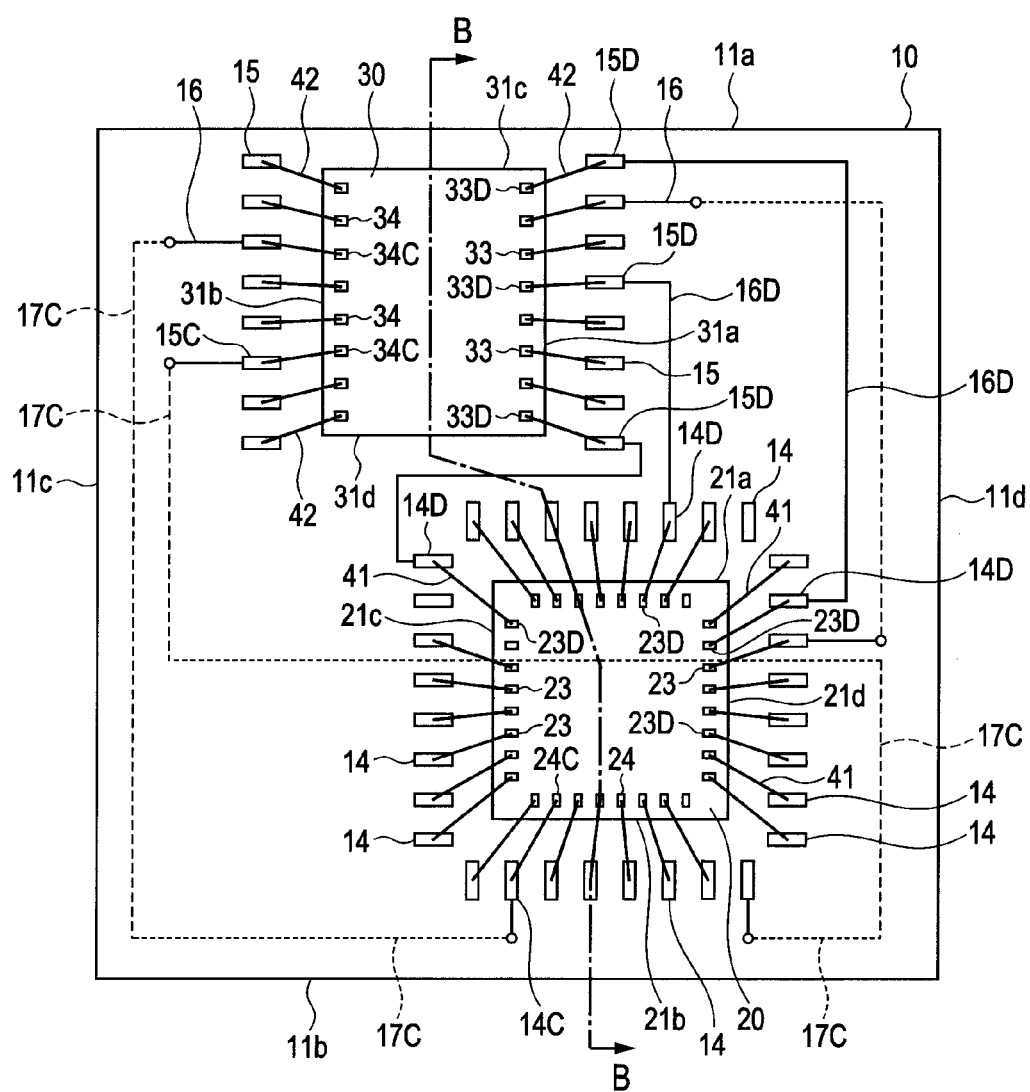
FIG. 2 is a plan view showing, in a simplified manner, the semiconductor device according to the first embodiment of the present invention.
Figure 3:
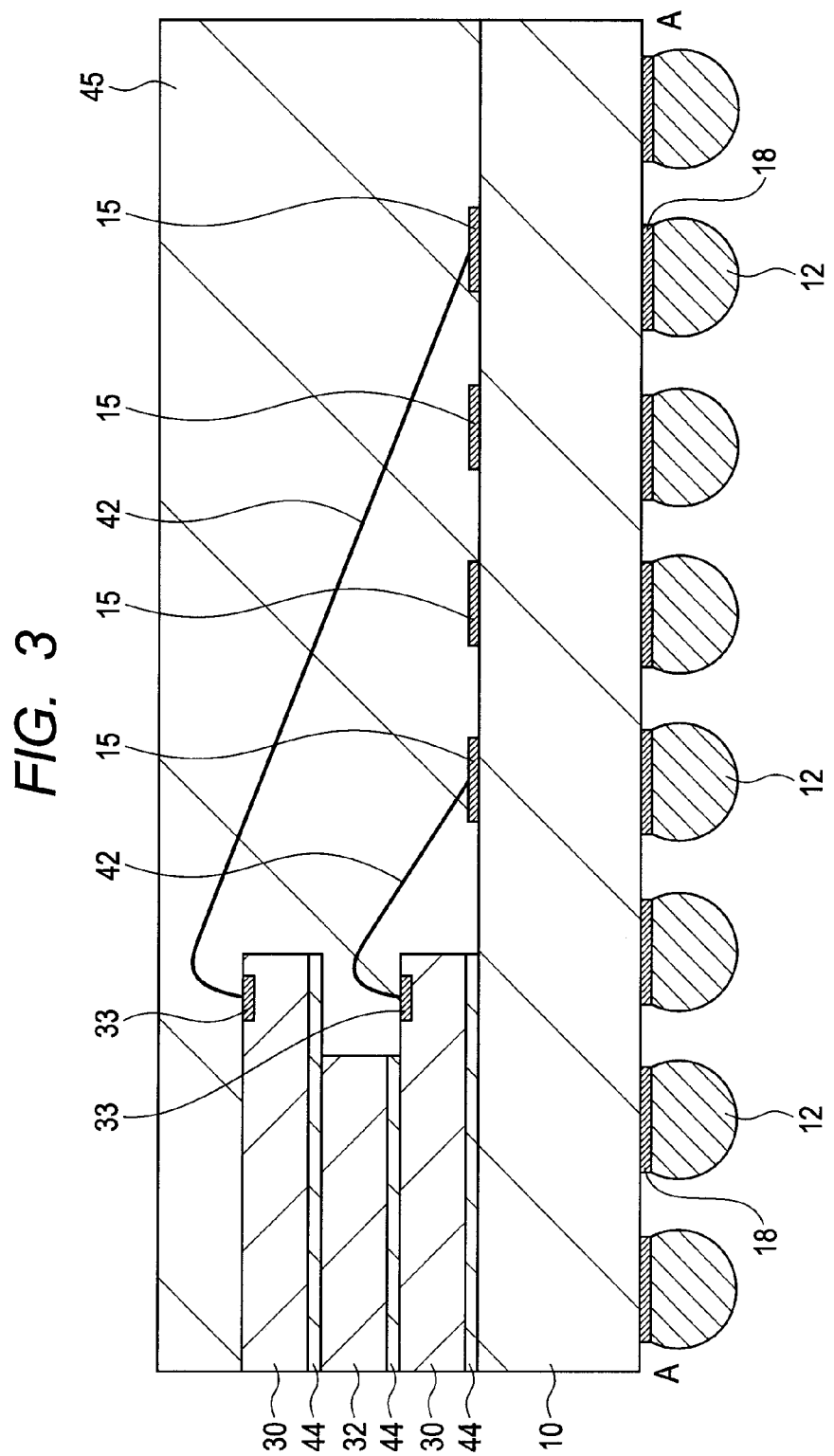
FIG. 3 is a cross-sectional view taken along line A-A of FIG. 1.
Figure 4:
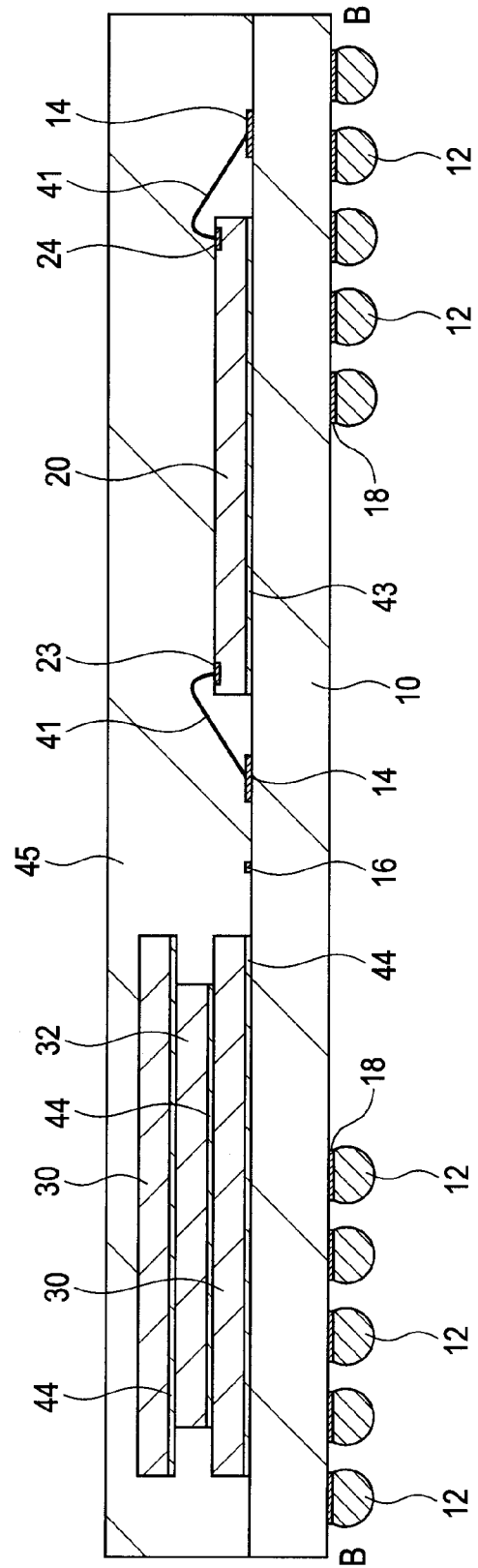
FIG. 4 is a cross-sectional view taken along line B-B of FIG. 2.
Figure 5A:
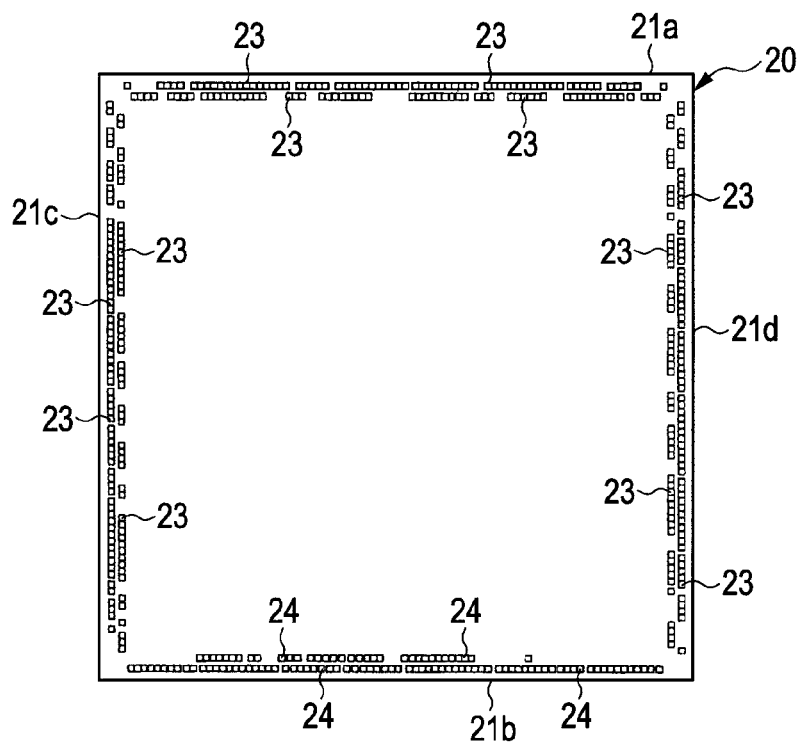
FIG. 5A is a plan view of a microcomputer chip mounted over an upper surface of a wiring board.
Figure 5B:
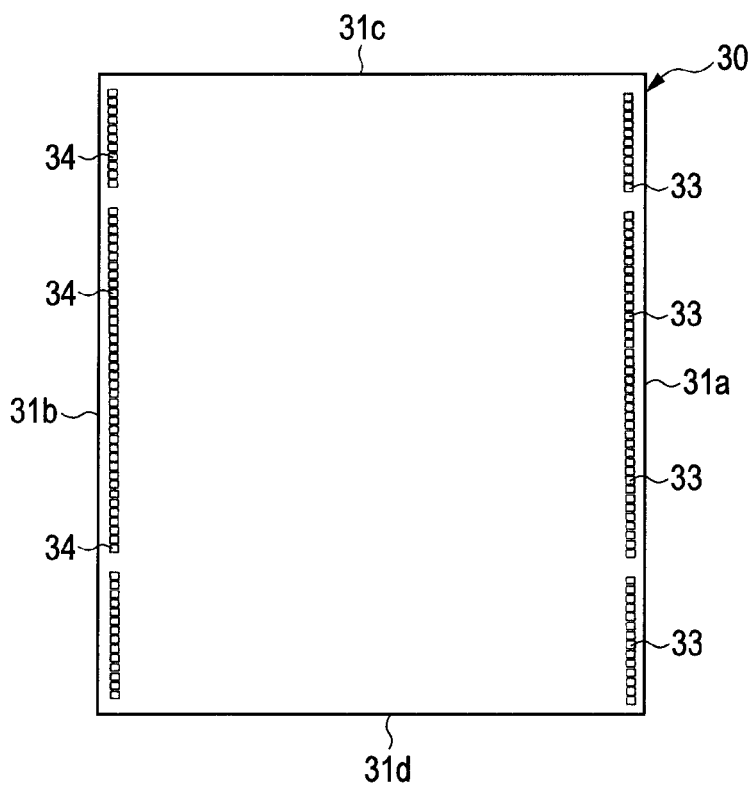
FIG. 5B is a plan views of a memory chip mounted over the upper surface of the wiring board.

FIG. 1 is an overall plan view of a semiconductor device according to the present embodiment; FIG. 2 is a plan view showing the semiconductor device according to the present embodiment in a simplified manner; FIG. 3 is a cross-sectional view taken along line A-A of FIG. 1; FIG. 4 is a cross-sectional view taken along line B-B of FIG. 2; FIG. 5A is a plan view of a microcomputer chip mounted over an upper surface of a wiring board; and FIG. 5B is a plan view of a memory chip mounted over the upper surface of the wiring board.

The semiconductor device of the present embodiment is a System In Package (SIP) type semiconductor device in which there are mounted, over an upper surface (surface) of a wiring board (substrate) 10, a microcomputer chip (also called a "controller chip") 20 and a plurality of (two, for example) memory chips 30 which the microcomputer chip 20 simultaneously accesses.

The wiring board 10 of the SIP type semiconductor device is a multilevel wiring board including Cu (copper) wirings (a front surface wiring, a back surface wiring, and an inner layer wiring) of a plurality of layers (for example, six layers), and its planer shape is a quadrangle (substantially square). That is, the wiring board 10 includes: a first substrate side 11a; a second substrate side 11b opposed to the first substrate side 11a; a third substrate side 11c orthogonal to the first substrate side 11a and the second substrate side 11b; and a fourth substrate side 11d opposed to the third substrate side 11c.

To the back surface wiring (conductive pad 18) formed over the lower surface (back surface) of the wiring board 10, as an external connection terminal of the SIP type semiconductor device, a plurality of solder balls 12 which include a ball grid array (BGA) are connected. Through these solder balls 12, the SIP type semiconductor device is mounted in a mother board of information communications equipment, etc.

The microcomputer chip 20 mounted over the upper surface of the wiring board 10 includes a silicon substrate whose planar shape is a quadrangle (substantially square). That is, the microcomputer chip 20 includes: a first chip side 21a; a second chip side 21b opposed to the first chip side 21a; a third chip side 21c orthogonal to both the first chip side 21a and the second chip side 21b; and a fourth chip side opposed to the third chip side 21c.

In the plan view, the microcomputer chip 20 is arranged over the upper surface of the wiring board 10 such that the first chip side 21a is adjacent to the first substrate side 11a of the wiring board 10 and the third chip side 21c is adjacent to the third substrate side 11c of the wiring board 10. In other words, the microcomputer chip 20 is arranged over the upper surface of the wiring board 10 such that the first chip side 21a and the second chip side 21b are parallel to the first substrate side 11a and the second substrate side 11b of the wiring board 10, respectively, and the third chip side 21c and the fourth chip side 21d are parallel to the third substrate side 11c and the fourth substrate side 11d of the wiring board 10, respectively.

Moreover, the microcomputer chip 20 is mounted by what is called a face-up mounting method with the surface (device surface) facing upward, and is fixed to the upper surface of the wiring board 10 through an adhesive 43. Though not shown, over the device surface of the microcomputer chip 20, there are formed circuits such as a memory interface for simultaneously accessing two memory chips 30, a memory controller, a CPU, a RAM, a PROM, a controller, a DMAC, a timer counter, and an input/output port.

In the periphery of the surface of the microcomputer chip 20, there are formed a plurality of electrode pads (bonding pads) along the four sides described above (the first chip side 21a, the second chip side 21b, the third chip side 21c, and the fourth chip side 21d), respectively. Of these electrode pads, the first electrode pads shown by reference numeral 23 are arranged along the first chip side 21a, the third chip side 21c, and the fourth chip side 21d, respectively. The second electrode pads shown by reference numeral 24 are arranged along the second chip side 21b. The first electrode pad 23 and the second electrode pad 24 include the external connection terminal of the microcomputer chip 20, and are electrically connected to the above circuit through the internal wiring.

As shown in FIG. 5A, the first electrode pads 23 of the microcomputer chip 20 are arranged in two rows along the first chip side 21a, the third chip side 21c, and the fourth chip side 21d, respectively. At the same time, the first electrode pads 23 in an inner row and the first electrode pads 23 in an outer row are arranged alternately. Similarly, the second electrode pads 24 are arranged in two rows along the second chip side 21b. At the same time, the second electrode pads 24 in an inner row and the second electrode pads 24 in an outer row are arranged alternately. In addition, in FIG. 2, for the sake of illustration, the first electrode pads 23 and the second electrode pads 24 are arranged in one row, respectively.

The above electrode pads (the first electrode pads 23, the second electrode pads 24) formed over the surface of the microcomputer chip 20 include data system pads (the pad for data input and output and the pad for data strobe), command/address system pads, clock input pads, power supply pads, etc. Among these pads, in particular, the data system pads (electrode pads shown by reference numeral 23D in FIG. 2) include any of the first electrode pads 23. That is, the data system electrode pads 23D are arranged along the first chip side 21a, the third chip side 21c, and the fourth chip side 21d of the microcomputer chip 20. Moreover, the command/address system pads (electrode pads shown by reference numeral 24C in FIG. 2) include any of the second electrode pads 24. That is, the command/address system electrode pads 24C are arranged along the second chip side 21b of the microcomputer chip 20.

Over the upper surface of the wiring board 10, a plurality of first conductive pads 14 are so arranged as to surround the microcomputer chip 20. That is, the first conductive pads 14 are arranged along the four sides (the first chip side 21a, the second chip side 21b, the third chip side 21c, the fourth chip side 21d) of the microcomputer chip 20. The first conductive pad 14 is integrally formed with a first wiring layer (surface wiring 16) formed closest to the upper surface side among the Cu wirings of a plurality of layers formed over the wiring board 10. Over the surface thereof, a plating layer including, for example, a nickel (Ni) layer and a gold (Au) layer is formed.

As shown in FIG. 1, the first conductive pads 14 are arranged along each of the four sides of the microcomputer chip 20, covering a plurality of (three, for example) rows. In addition, in FIG. 2, for the sake of illustration, the first conductive pads 14 are arranged in one row along each of the four sides of the microcomputer chip 20. Each of the first conductive pads 14 and each of the first electrode pads 23 and the second electrode pads 24 formed in the microcomputer chip 20 are electrically connected with each other through a first wire 41 containing Au or Cu.

As described above, the first electrode pads 23 including the data system electrode pads 23D are arranged along the first chip side 21a, the third chip side 21c, and the fourth chip side 21d of the microcomputer chip 20. Further, as shown in FIG. 2, of the first conductive pads 14 formed over the wiring board 10, the first data system conductive pads 14D electrically connected to the data system electrode pads 23D of the microcomputer chip 20 through the first wires 41 also are arranged along the first chip side 21a, the third chip side 21c, and the fourth chip side 21d of the microcomputer chip 20.

Further, as described above, the second electrode pads 24 including the command/address system electrode pads 24C are arranged along the second chip side 21b of the microcomputer chip 20. Still further, as shown in FIG. 2, of the first conductive pads 14 formed over the wiring board 10, the first command/address system conductive pads 14C electrically connected to the command/address system electrode pads 24C of the microcomputer chip 20 through the first wire 41 are arranged along the second chip side 21b of the microcomputer chip 20.

Over the upper surface of the wiring board 10, there are mounted two memory chips 30 adjacent to the microcomputer chip 20. Each of the two memory chips 30 includes a rectangular silicon substrate. Namely, each of the two memory chips 30 includes: a first chip side 31a; a second chip side 31b facing to the first chip side 31a; a third chip side 31c orthogonal to the first chip side 31a and the second chip side 31b; and a fourth chip side 31d facing to the third chip side 31c.

In the plan view, each of the two memory chips 30 is disposed over the upper surface of the wiring board 10 such that the third chip side 31c is adjacent to the first substrate side 11a of the wiring board 10 and the second chip side 31b is adjacent to the third substrate side 11c of the wiring board 10. In other words, each of the two memory chips 30 is disposed over the upper surface of the wiring board 10 such that the first chip side 31a and the second chip side 31b are parallel to the third substrate side 11c and the fourth substrate side 11d of the wiring board 10, respectively and, at the same time, the third chip side 31c and the fourth chip side 31d are parallel to the first substrate side 11a and the second substrate side 11b of the wiring board 10, respectively.

Figure 6:
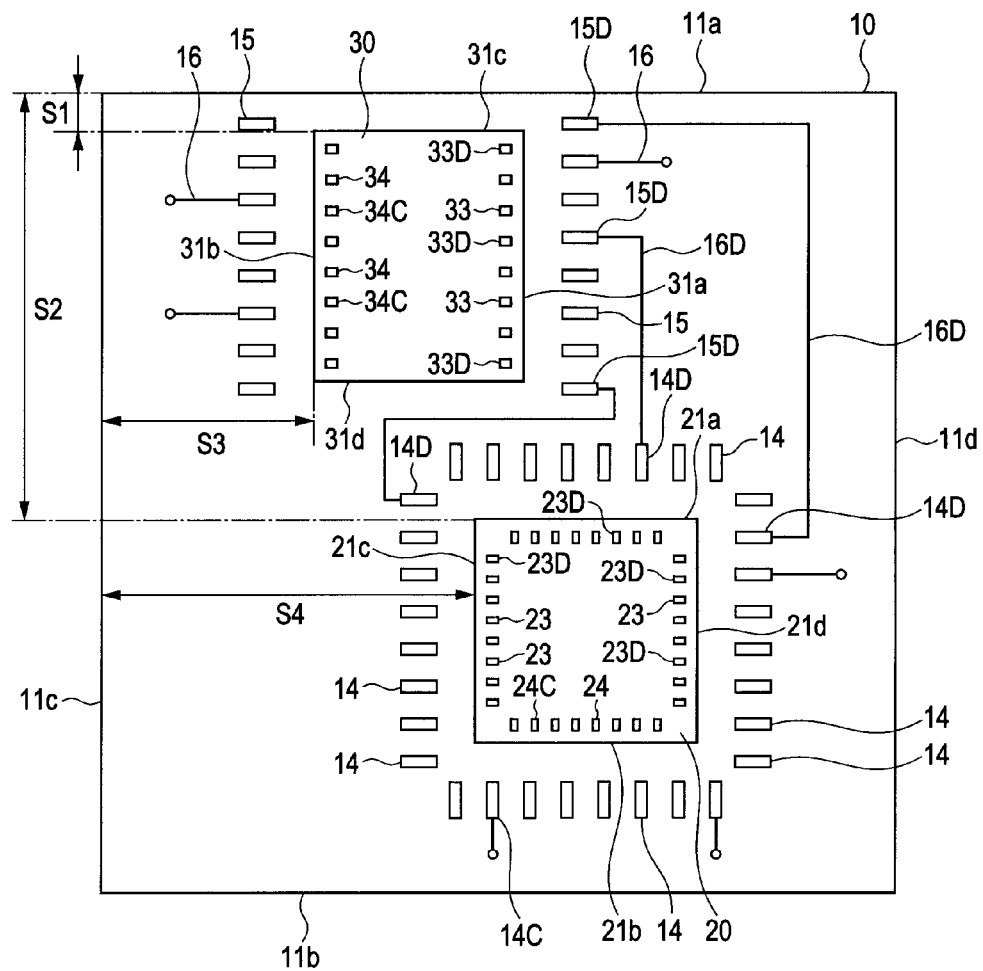
FIG. 6 is a plan view showing, in a simplified manner, the semiconductor device according to the first embodiment of the present invention.

As shown in FIG. 6, each of the two memory chips 30 is mounted adjacent to the microcomputer chip 20 such that, in the plan view, a spacing (S1) between the third chip side 31c and the first substrate side 11a of the wiring board 10 is smaller than a spacing (S2) between the first chip side 21a of the microcomputer chip 20 and the first substrate side 11a (S1<S2) and such that a spacing (S3) between the second chip side 31b and the third substrate side 11c is smaller than a spacing (S4) between the third chip side 21c of the microcomputer chip 20 and the third substrate side 11c (S3<S4).

Moreover, each of the two memory chips 30 is mounted by what is called a face-up mounting method with the surface (device surface) thereof facing upward. At the same time, each of the two memory chips 30 is mounted by a stacking method in which one memory chip 30 is stacked over another memory chip 30. Between a memory chip 30 in a lower layer and a memory chip 30 in an upper layer, in order to expose the peripheral portion of the surface of the lower-layer memory chip 30, there is disposed a spacer 32 including a silicon chip whose area is smaller than that of the memory chip 30. Furthermore, die attach films 44, which are film-like adhesives, are put between the upper surface of the wiring board 10 and the memory chip 30 in the lower layer, between the memory chip 30 in the lower layer and the spacer 32, and between the spacer 32 and the memory chip 30 in the upper layer, respectively. That is, the memory chip 30 in the lower layer is fixed to the upper surface of the wiring board 10 through the die attach film 44, the spacer 32 is fixed to the upper surface of the memory chip 30 in the lower layer through the die attach film 44, and the memory chip 30 in the upper layer is fixed to the upper surface of the spacer 32 through the die attach film 44.

Though not shown, over the device surface of each of the two memory chips 30, there is formed a DDR-SDRAM circuit which has, for example, a storage capacity of 512 Mbytes. The DDR-SDRAM is a clock synchronized memory which reads and writes data during both the rise and decay of external clock signals.

Over each surface of the two memory chips 30, a plurality of electrode pads (bonding pads) are formed along each of the first chip side 31a and the second chip side 31b. Of these electrode pads, the first electrode pads shown by reference numeral 33 are arranged along the first chip side 31a, and the second electrode pads shown by reference numeral 34 are arranged along the second chip side 31b. The first electrode pad 33 and the second electrode pad 34 include the external connection terminal of the memory chip 30, and are electrically connected to the DDR-SDRAM circuit through the internal wiring.

As shown in FIG. 5B, the first electrode pads 33 of the memory chip 30 are arranged in one row along the first chip side 31a. Similarly, the second electrode pads 34 are arranged in one row along the second chip side 31b.

The plurality of electrode pads formed over the surface of the memory chip 30 include data system pads (pads for data input and output and the pads for data strobe), command/address system pads, power supply pads, etc. In addition, of these electrode pads, the data system pads (the electrode pads shown by reference numeral 33D in FIG. 2) in particular include any of the first electrode pads 33. That is, the data system electrode pads 33D are arranged along the first chip side 31a of the memory chip 30. Moreover, the command/address system pads (the electrode pads indicated by reference numeral 34C in FIG. 2) include any of the second electrode pads 34. That is, the command/address system electrode pads 34C are arranged along the second chip side 31b of the memory chip 30.

Over the upper surface of the wiring board 10, the second conductive pads 15 are arranged along the first chip side 31a and the second chip side 31b of the memory chip 30. Like the first conductive pads 14 arranged around the microcomputer chip 20, the second conductive pad 15 is integrally formed with the first wiring layer (surface wiring 16) positioned at the uppermost surface side among the Cu wirings in the plurality of layers formed in the wiring board 10. Over the surface thereof, a plated layer including, for example, a Ni layer or an Au layer is formed.

As shown in FIG. 1, the second conductive pads 15 arranged along the first chip side 31a of the memory chip 30 are disposed in a plurality of rows (for example, four rows). Moreover, the second conductive pads 15 are arranged in a region, in the plan view, between an extended line of the third chip side 21c and an extended line of the fourth chip side 21d of the microcomputer chip 20. This is because, as described above, the data system electrode pads 23D of the microcomputer chip 20 are arranged along the first chip side 21a, the third chip side 21c, and the fourth chip side 21d of the microcomputer chip 20. In addition, in FIG. 2, for the sake of illustration, the second conductive pads 15 are arranged in one row.

Each of the first electrode pads 33 and the second electrode pads 34 formed over the surface of the memory chip 30 is electrically connected to any one of the second conductive pads 15 through a second wire 42 containing Au or Cu.

As a conductive member, when electrically coupling the memory chip 30 with the wiring board 10 using, for example, a wire (the second wire 42), it is necessary that a pitch of adjacent conductive pads among the conductive pads (the second conductive pads 15) is larger than a pitch of the electrode pads (the first electrode pads 33 and the second electrode pad 34) of the memory chip 30.

One of the specific reasons for this is based on movement of a capillary used in a wire bonding process. That is, on a first bonding side, the capillary is moved perpendicularly to the surface of an object (the electrode pad of the semiconductor chip in the present embodiment) to which a wire is connected, and part of the wire is connected to the object. However, on a second bonding side, with respect to the surface of an object (the conductive pad of the wiring board in the present embodiment) to which the wire is connected, the capillary is moved horizontally and other part of the wire is connected to the object (forward bonding method). For this reason, it is necessary that a surface area of the object to be on the second bonding side is larger than a surface area of the object to be on the first bonding side or that the part of the wire connected to the object on the second bonding side does not come in contact with (does not stretch over) the adjacent object. According to the present embodiment, as described above, the pitch of the adjacent conductive pads among the conductive pads (second conductive pads 15) is greater than the pitch of the electrode pads (the first electrode pad 33 and the second electrode pad 34) of the memory chip 30. In addition, another reason for the pitches to be different is that semiconductor chips are produced with use of a process different from that of a wiring board (processing precision is different).

As a result, the width of the row of conductive pads (see FIG. 2) becomes larger than the side (the first chip side 31a, the second chip side 31b) of the memory chip 30. When the second wire 42 is connected to the second conductive pad 15 provided on the end portion side of the conductive pad row, an angle of inclination of the second wire 42 in the plan view gets greater, and it becomes difficult to stabilize the loop configuration.

Therefore, as shown in FIG. 1, the present inventors have discussed arranging the second conductive pads 15 in a plurality of rows. In this way, the width of the conductive pad row has been made smaller.

However, there arises a new problem. Since the second conductive pads 15 are arranged in multiple rows, in FIG. 5 of Patent Document 1, when mounting the side provided with conductive pads of the memory chip facing the microcomputer chip, a space for arrangement of the plurality of conductive pad rows must be provided between the memory chip and the microcomputer chip, making it difficult to use a substrate whose outer size is small.

As described above, the first electrode pads 33 including the data system electrode pads 33D are arranged along the first chip side 31a of the memory chip 30. Then, as shown in FIG. 2, of the second conductive pads 15 formed over the wiring board 10, the second data system conductive pads 15D electrically connected to the data system electrode pads 33D of the memory chip 30 through the second wire 42 are arranged along the first chip side 31a of the memory chip 30.

Moreover, as described above, the second electrode pads 34 including the command/address system electrode pads 34C are arranged along the second chip side 31b of the memory chip 30. Then, as shown in FIG. 2, of the second conductive pads 15 formed over the wiring board 10, the second command/address system conductive pads 15C electrically connected to the command/address system electrode pads 34C of the memory chip 30 through the second wires 42 are arranged along the second chip side 31b of the memory chip 30.

Each of the second conductive pads 15 arranged along two sides (the first chip side 31a and the second chip side 31b) of the memory chip 30 and each of the first conductive pads 14 arranged along four sides (the first chip side 21a, the second chip side 21b, the third chip side 21c, and the fourth chip side 21d) of the microcomputer chip 20 are electrically connected with each other through the Cu wirings in a plurality of layers formed over the wiring board 10.

Further, the second data system conductive pads 15D arranged along the first chip side 31a of the memory chip 30 and each of the first data system electrode pads 14D arranged along three sides (the first chip side 21a, the third chip side 21c, and the fourth chip side 21d) of the microcomputer chip 20 are electrically connected with each other through the data system wiring 16D formed on the uppermost surface side (in the first wiring layer) among the plurality of Cu wirings formed over the wiring board 10.

Also, the second command/address system conductive pads 15C arranged along the second chip side 31b of the memory chip 30 and each of the first command/address conductive pads 14C arranged along the second chip side 21b of the microcomputer chip 20 are electrically connected with each other through the command/address system wiring 17C, among the plurality of Cu wirings formed over the wiring board 10, formed in a wiring layer (the second wiring layer) which is different from the above data system wiring 16D.

The microcomputer chip 20 mounted over the upper surface of the wiring board 10, the memory chip 30, a first wire 41 for electrically coupling the microcomputer chip 20 with the first conductive pad 14, and a second wire 42 for electrically coupling the memory chip 30 with the second conductive pad 15 are sealed with a mold resin 45 of an epoxy resin system.

According to the structure of the present embodiment described above in detail, it is possible to minimize the length of the data system wiring 16D which couples the data system electrode pad 23D of the microcomputer chip 20 mounted over the upper surface of the wiring board 10 with the data system electrode pad 33D of the memory chip 30.

As a result, since the outer dimensions of the wiring board 10 can be made small, the miniaturization of an SIP type semiconductor device can be promoted. Also, the acceleration of the operating speed of the SIP type semiconductor device can be promoted because it is possible to shorten the writing speed of data to the memory chip 30 and the reading speed of data from the memory chip 30.

Next, with reference to FIGS. 7 to 23, an example of assembly procedure of the SIP type semiconductor device configured as above will be explained.

Figure 7:
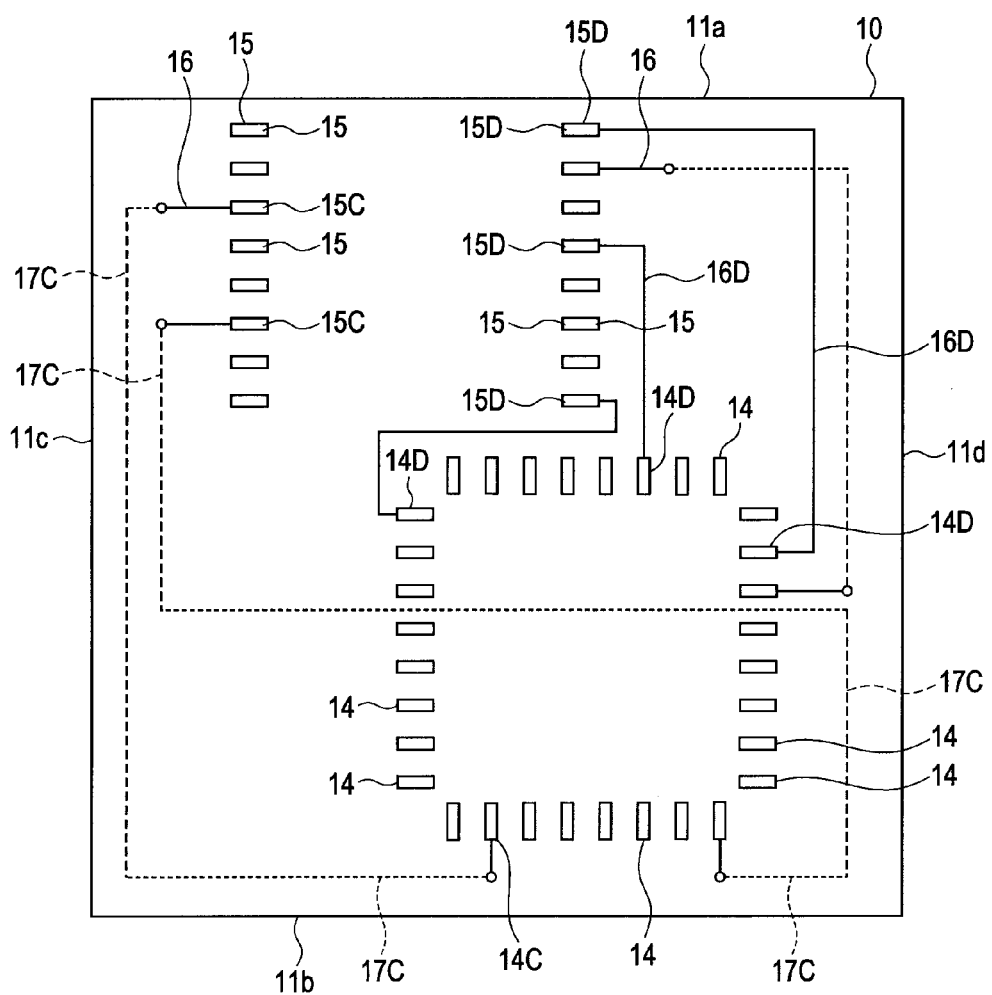
FIG. 7 is a plan view of a manufacturing process showing steps in the manufacture of the semiconductor device according to the first embodiment of the present invention.
Figure 8:
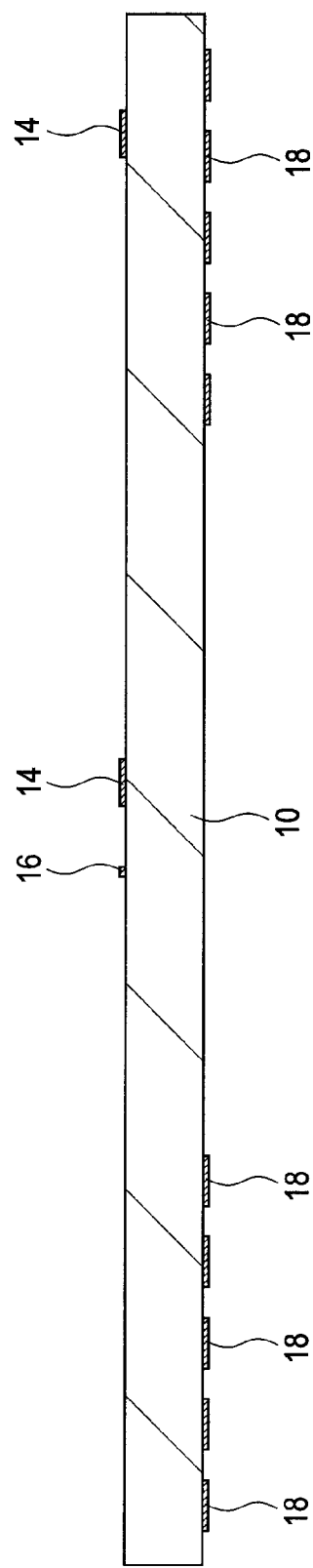
FIG. 8 is a cross-sectional view of the manufacturing process showing steps in the manufacture of the semiconductor device according to the first embodiment of the invention.

First, the wiring board 10 shown in FIGS. 7 and 8 will be prepared. The wiring board 10 is a multilevel wiring board which has multiple wiring layers. According to the present embodiment, the wiring board 10 has, for example, six wiring layers. Over the upper surface thereof, there are formed a plurality of upper surface wirings 16, the first conductive pads 14 formed integrally with the upper surface wirings 16, and the second conductive pads 15. Inside the wiring board 10, there are formed inner wirings of four layers including command/address system wirings 17C and a power supply wiring. Over the lower surface of the wiring board 10, a plurality of conductive pads 18 being back surface wirings are formed. Though not shown, except for the surfaces of the first conductive pads 14 and the second conductive pads 15, the upper surface of the wiring board 10 is covered with a solder resist. Moreover, except for the surfaces of the conductive pads 18, the upper surface of the wiring board 10 is covered with the solder resist.

Figure 9:
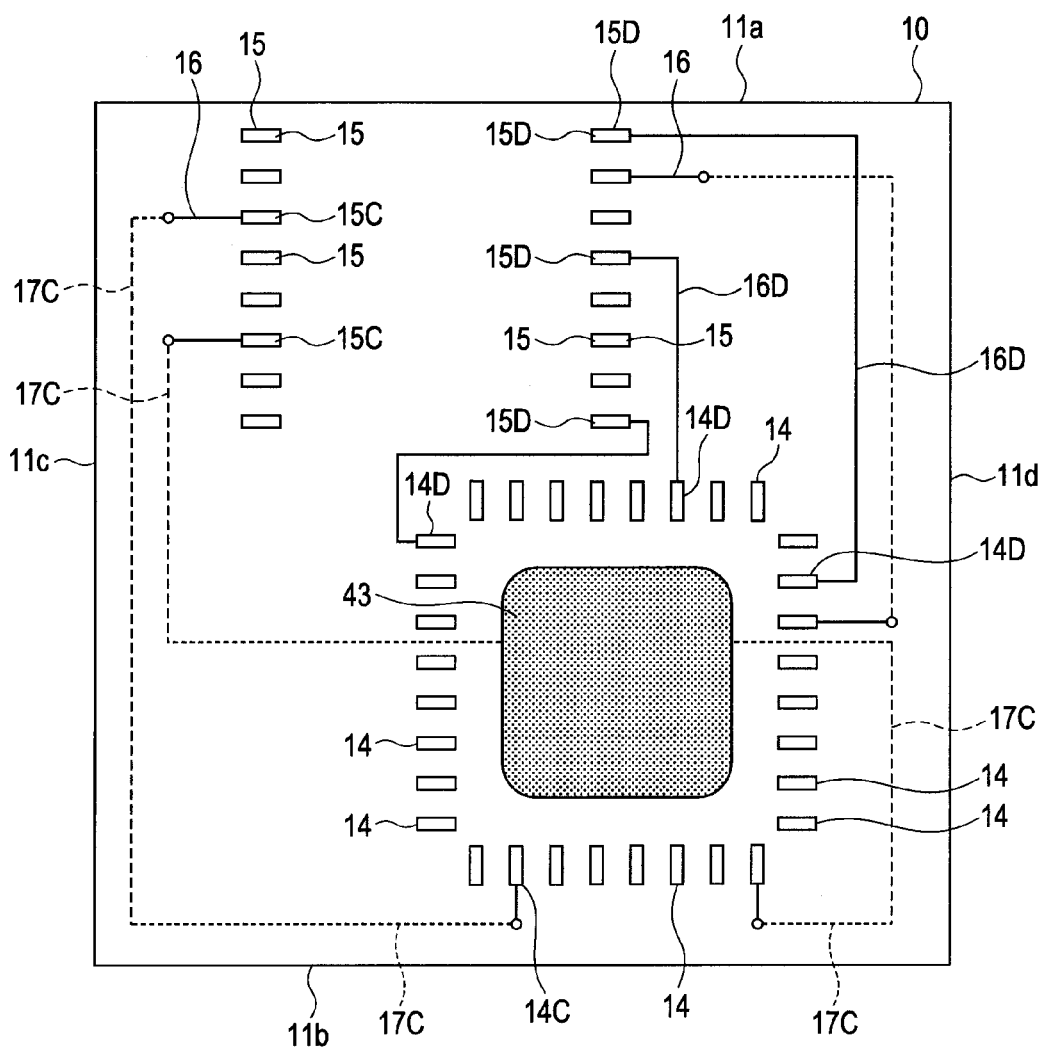
FIG. 9 is a plan view of the semiconductor device during a manufacturing step following that of FIGS. 7 and 8.
Figure 10:
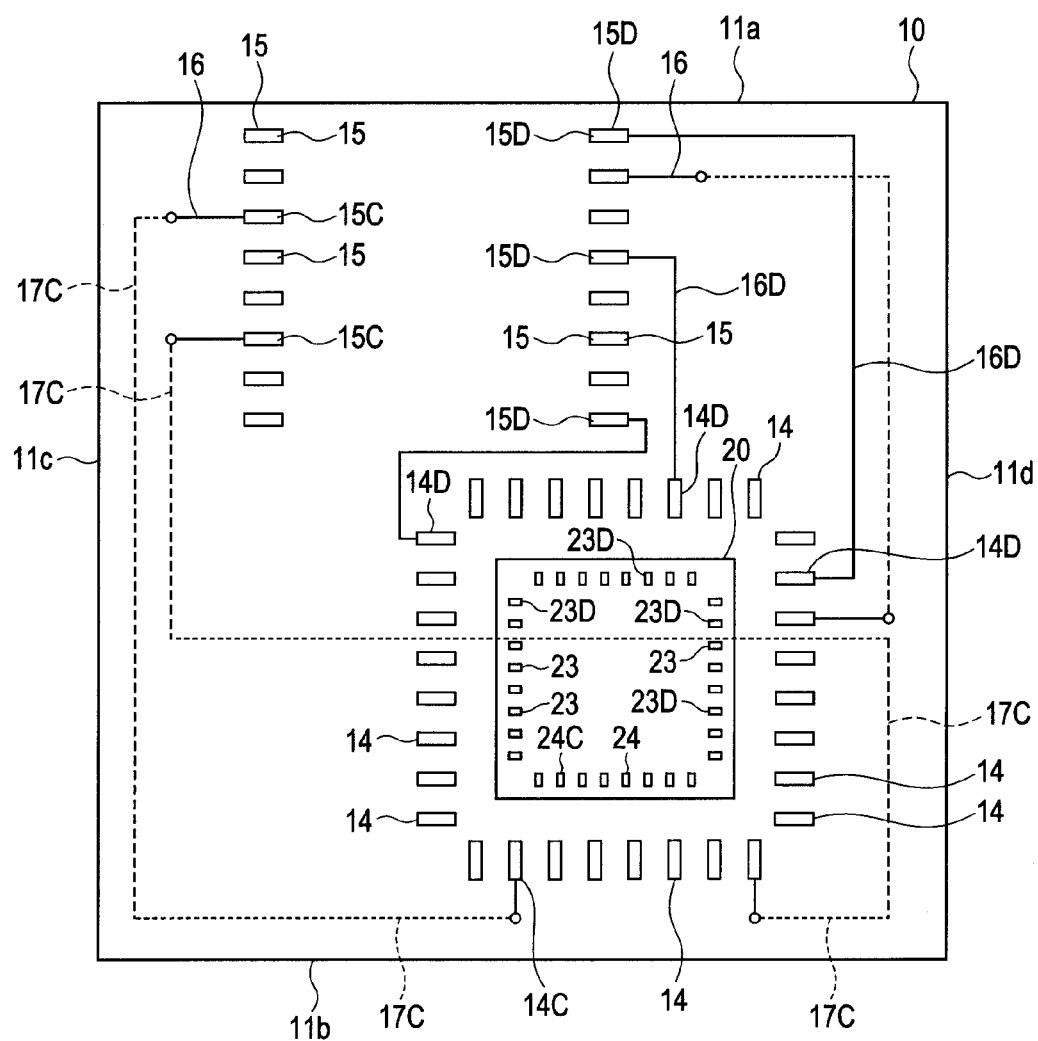
FIG. 10 is a plan view of the semiconductor device during a manufacturing step following that of FIG. 9.
Figure 11:
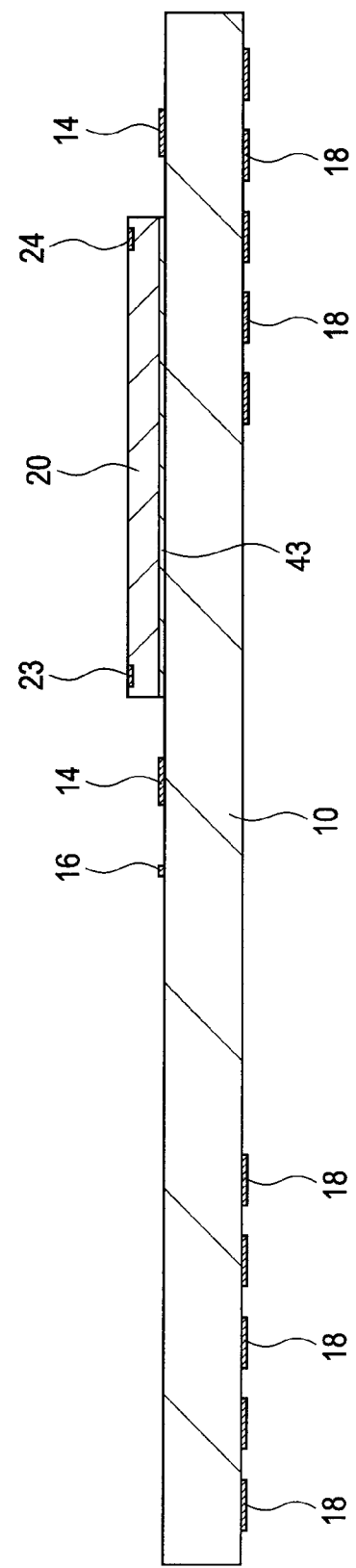
FIG. 11 is a cross-sectional view of the semiconductor device during a manufacturing step following that of FIG. 9.

As shown in FIG. 9, a paste-like adhesive (paste material) 43 is applied to a microcomputer chip mounting region in the upper surface of the wiring board 10. Then, as shown in FIGS. 10 and 11, the microcomputer chip 20 is mounted over the upper surface of the wiring board 10 such that the back surface thereof is facing to the microcomputer chip mounting region of the wiring board 10. Needless to say, the microcomputer chip 20 may be mounted over the upper surface of the wiring board 10 using an adhesive material other than the paste-like adhesive (paste material) 43.

Figure 12:
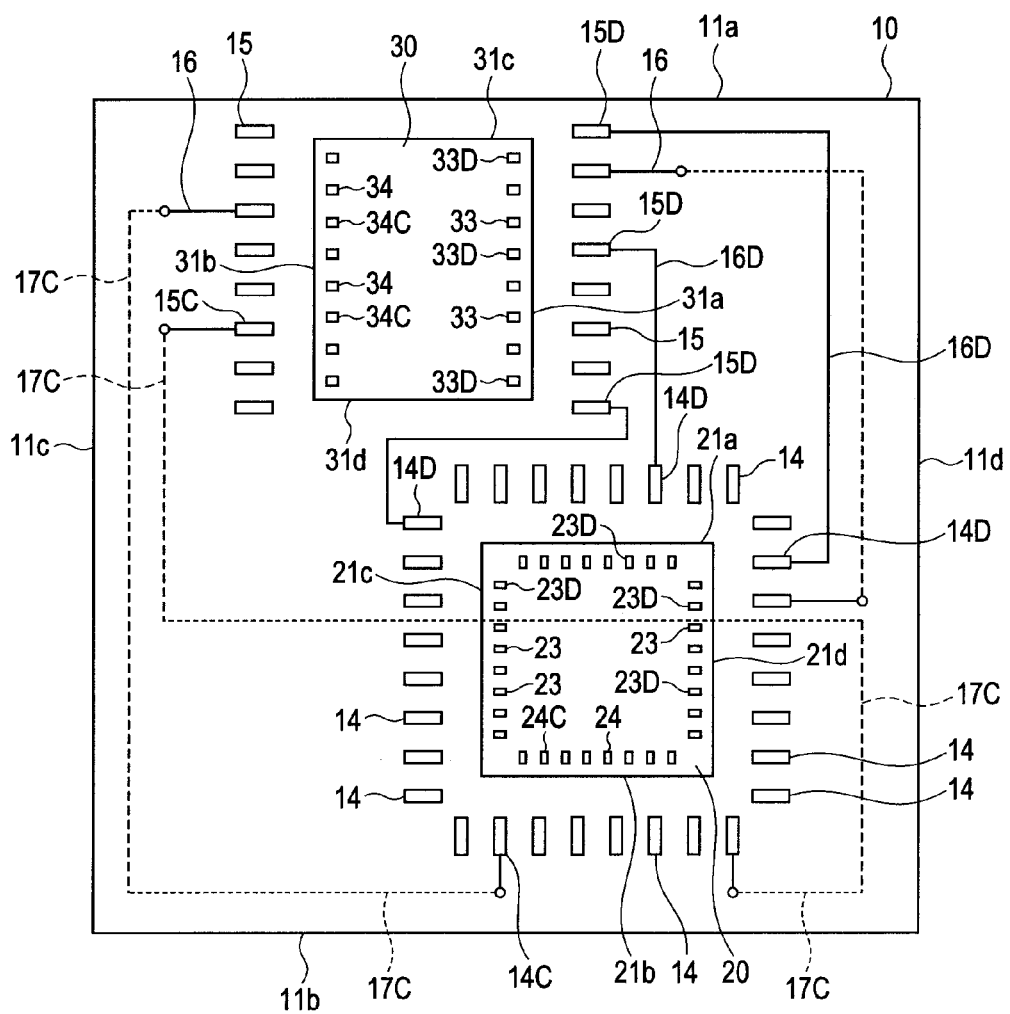
FIG. 12 is a plan view of the semiconductor device during a manufacturing step following that of FIG. 10 and FIG. 11.
Figure 13:
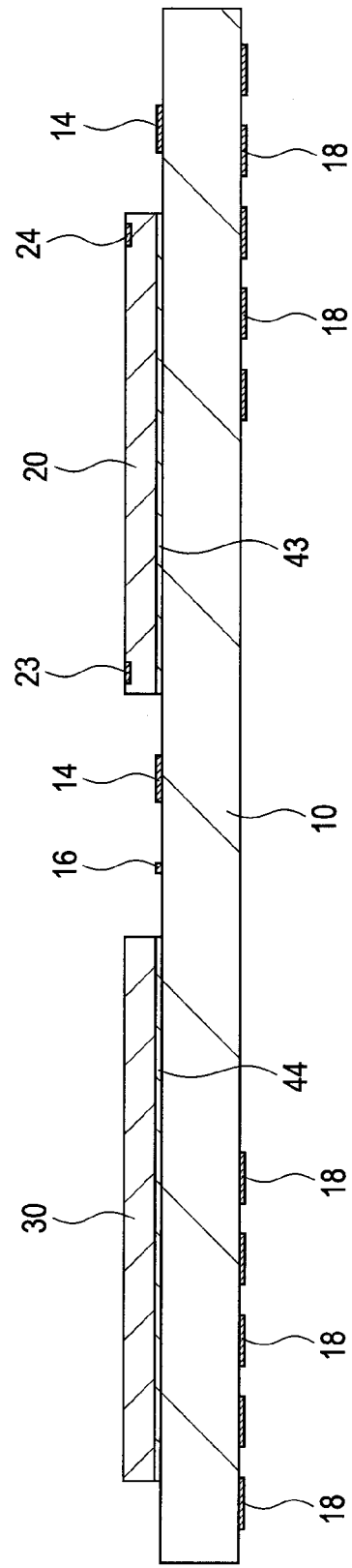
FIG. 13 is a cross-sectional view of the semiconductor device during a manufacturing step following that of FIGS. 10 and 11.

Next, as shown in FIGS. 12 and 13, a memory chip 30 of a first stage (lower layer) is mounted in a memory chip mounting region in the upper surface of the wiring board 10 through a die attach film 44. After a process (pre-process) of forming a DDR-SDRAM circuit over a silicon wafer is finished, the die attach film 44 is bonded to the back surface of the silicon wafer. When the memory chip 30 is obtained by dicing the silicon wafer, the film is diced together with the silicon wafer. Needless to say, the memory chip 30 may be mounted over the upper surface of the wiring board 10 using an adhesive material other than the die attach film 44.

Figure 14:
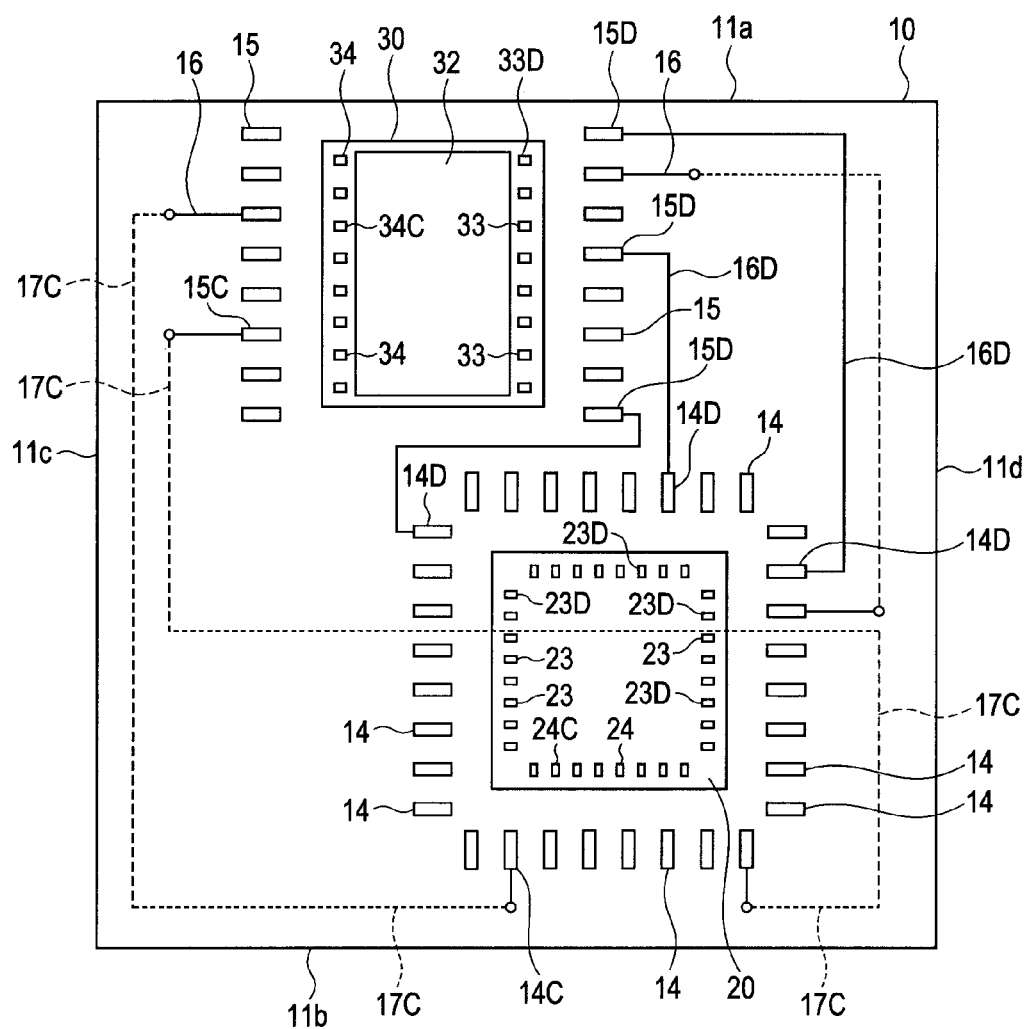
FIG. 14 is a plan view of the semiconductor device during a manufacturing step following that of FIGS. 12 and 13.
Figure 15:
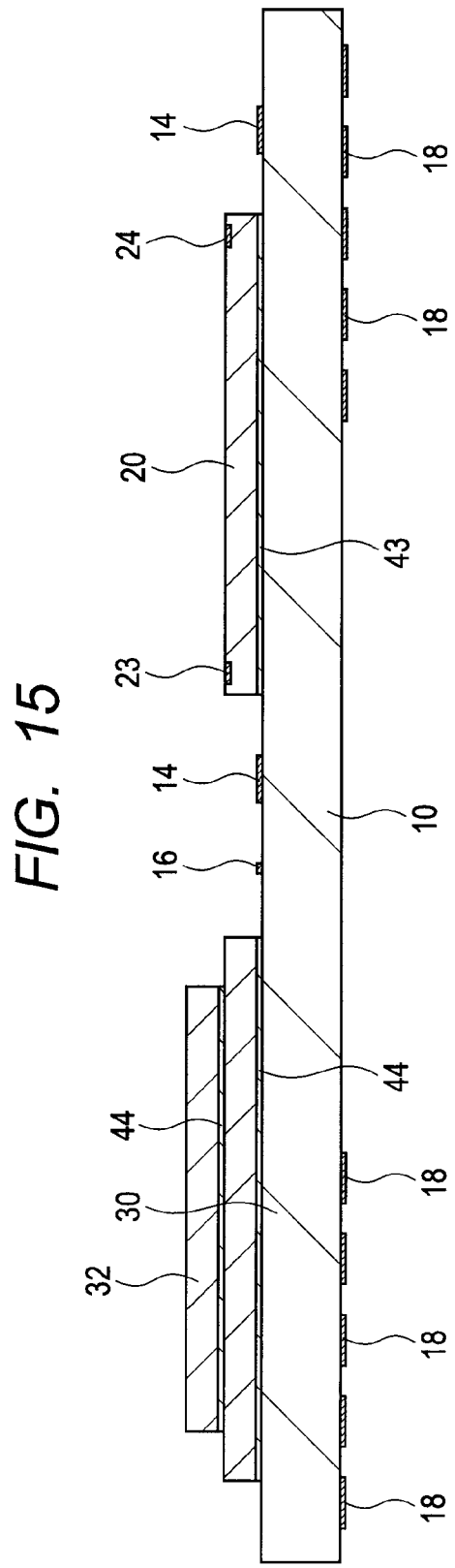
FIG. 15 is a cross-sectional view of the semiconductor device during a manufacturing step following that of FIGS. 12 and 13.

Next, as shown in FIGS. 14 and 15, a spacer 32 is mounted over the memory chip 30 of the first stage through the die attach film 44. The spacer 32 includes a silicon chip whose area is smaller than that of the memory chip 30. Therefore, when the spacer 32 is mounted over the memory chip 30 of the first stage, the first electrode pad 33 and the second electrode pad 34 formed over the surface of the memory chip 30 of the first stage are not covered with the spacer 32.

In addition, the order of mounting the microcomputer chip 20 and the memory chip 30 may be reversed. That is, the microcomputer chip 20 may be mounted over the upper surface of the wiring board 10 after mounting the memory chip 30 of the first stage over the upper surface of the wiring board 10 and mounting the spacer 32 over the upper portion thereof.

Figure 16:
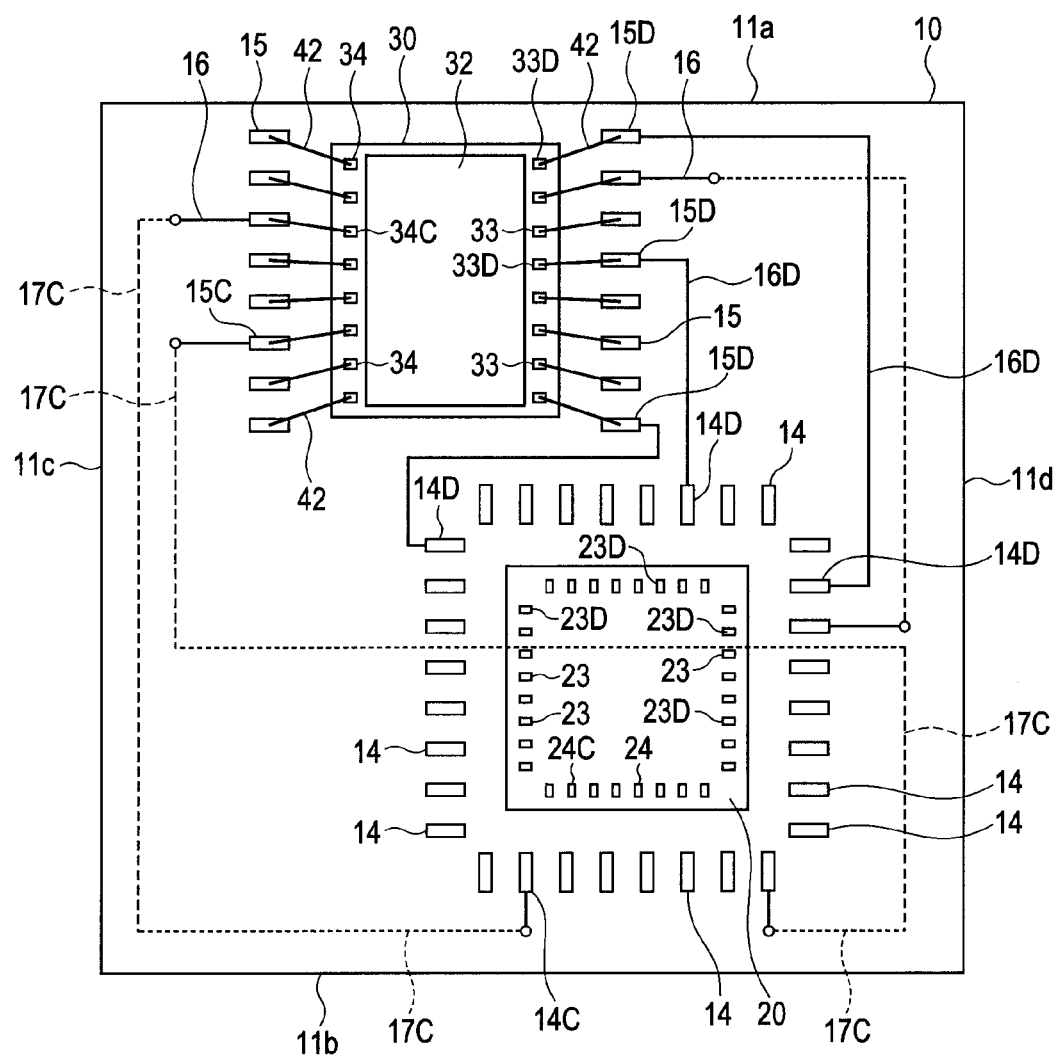
FIG. 16 is a plan view of the semiconductor device during a manufacturing step following that of FIGS. 14 and 15.
Figure 17:
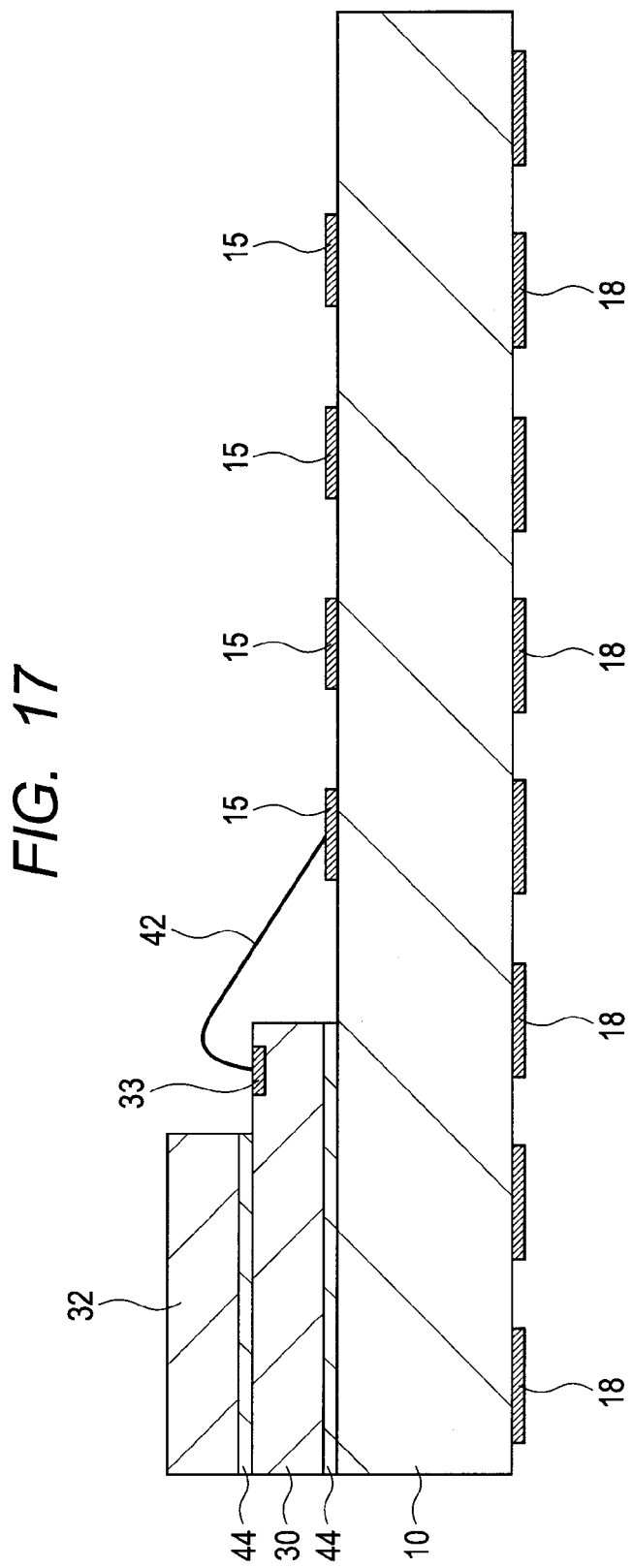
FIG. 17 is an enlarged cross-sectional view of a principal part of the semiconductor device during a manufacturing step following that of FIGS. 14 and 15.

Next, as shown in FIGS. 16 and 17, for example, with use of a ball bonding method using both heat and ultrasound, the first electrode pads 33 of the memory chip 30 and the second conductive pads 15 of the wiring board 10 as well as the second electrode pads 34 and the second conductive pads 15 are electrically connected by the second wires 42, respectively. In this regard, there is employed what is called a forward bonding method in which, first, one end of the second wire 42 is connected to the electrode pad (the first electrode pad 33, the second electrode pad 34) of the memory chip 30 and, then, the other end of the second wire 42 is connected to the second conductive pad 15 of the wiring board 10.

Figure 18:
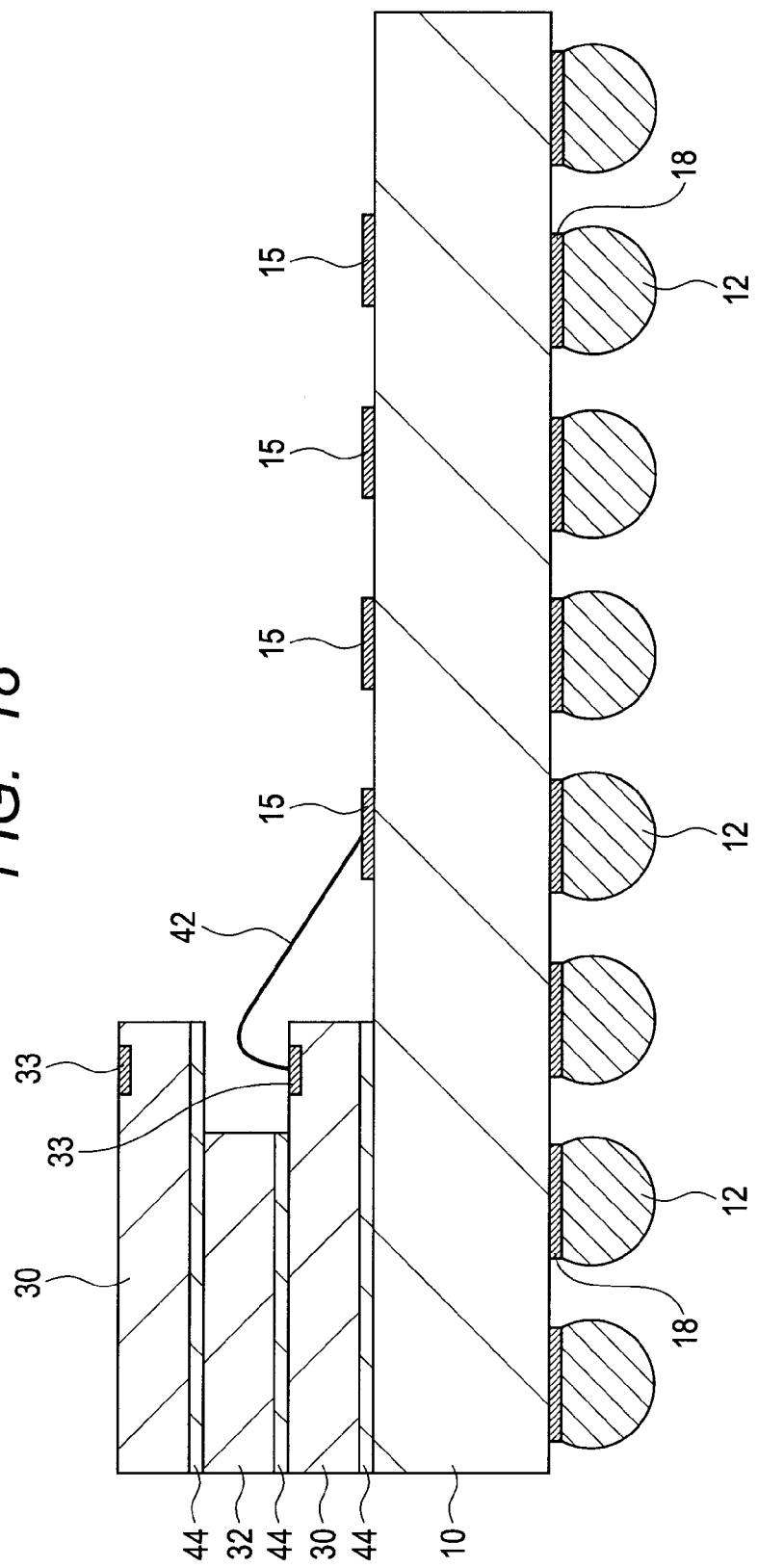
FIG. 18 is an enlarged cross-sectional view of a principal part of the semiconductor device during a manufacturing step following that of FIGS. 16 and 17.

Next, as shown in FIG. 18, a memory chip 30 of a second stage (upper layer) is stacked over an upper portion of the spacer 32 through the die attach film 44.

Figure 19:
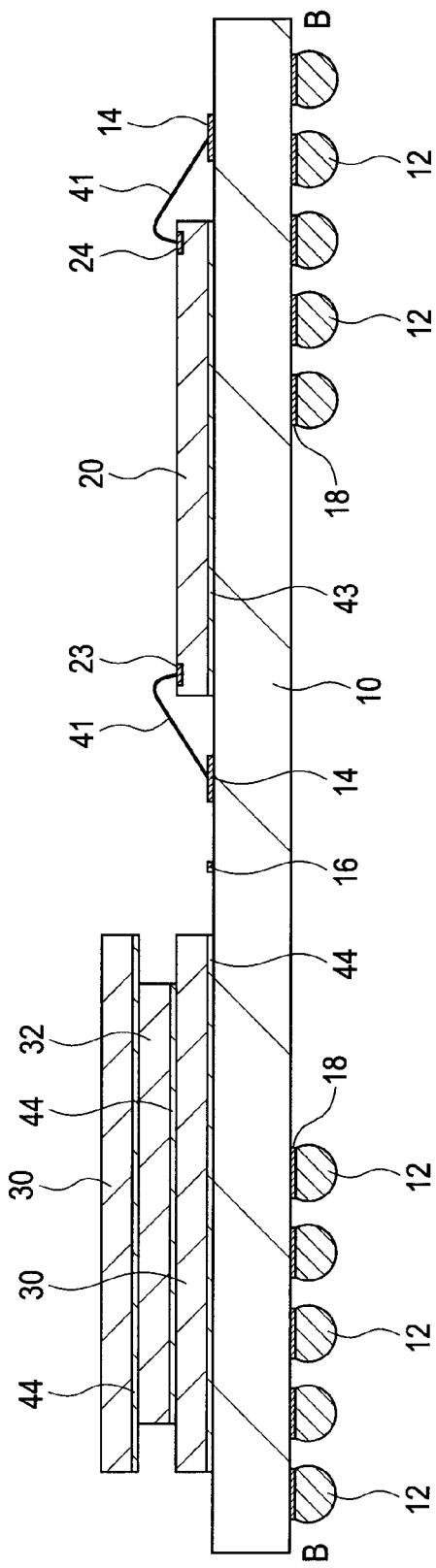
FIG. 19 is a cross-sectional view of the semiconductor device during a manufacturing step following that of FIG. 18.

Next, as shown in FIG. 19, by employing the ball bonding method described above, a first electrode pad 23 of the microcomputer chip 20 and a first conductive pad 14 of the wiring board 10 as well as a second electrode pad 24 and the first conductive pad 14 are electrically connected by a first wire 41, respectively. In this regard, there is employed what is called a forward bonding method in which, first, one end of the first wire 41 is connected to the electrode pad (the first electrode pad 23, the second electrode pad 24) of the microcomputer chip 20 and, then, the other end of the first wire 41 is connected to the first conductive pad 14 of the wiring board 10.

Figure 20:
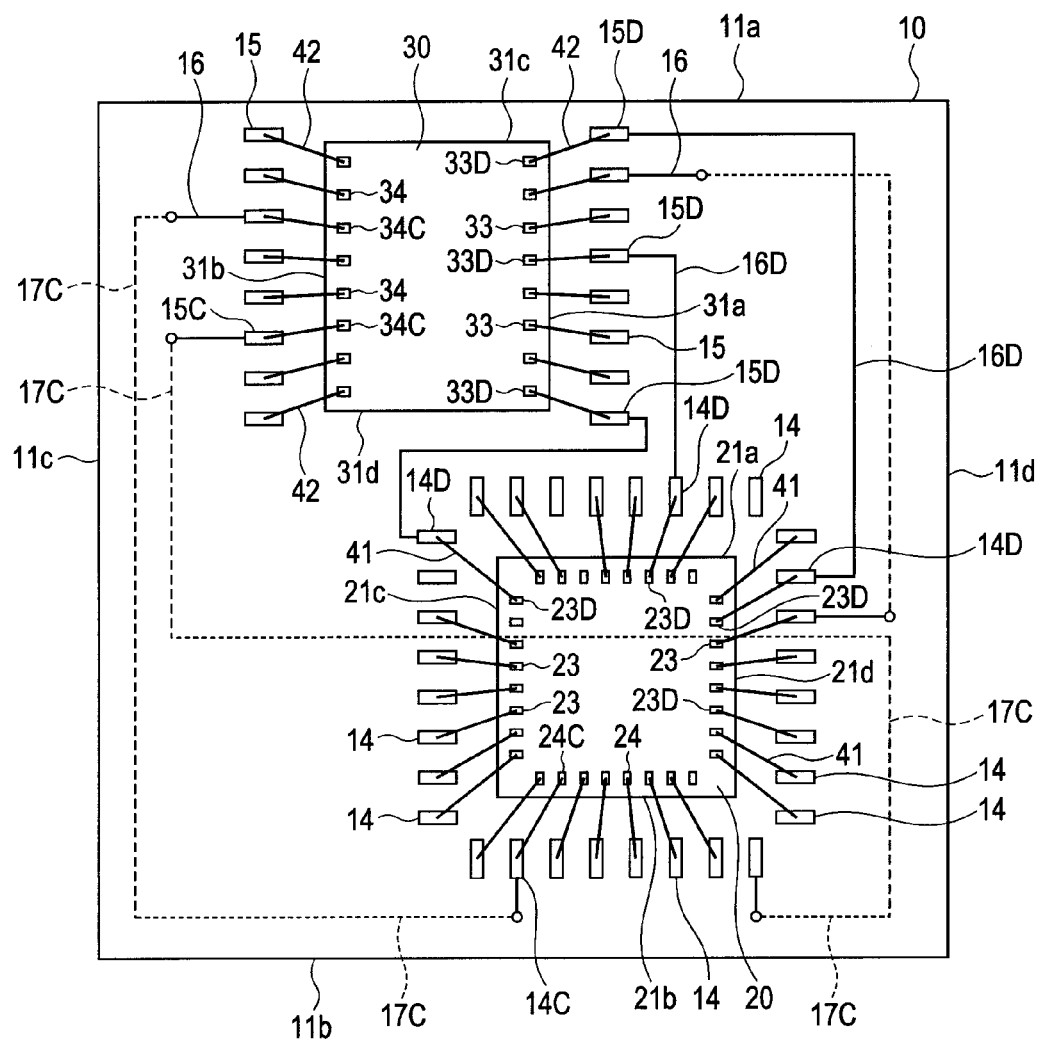
FIG. 20 is a plan view showing the semiconductor device during a manufacturing step following that of FIG. 19.
Figure 21:
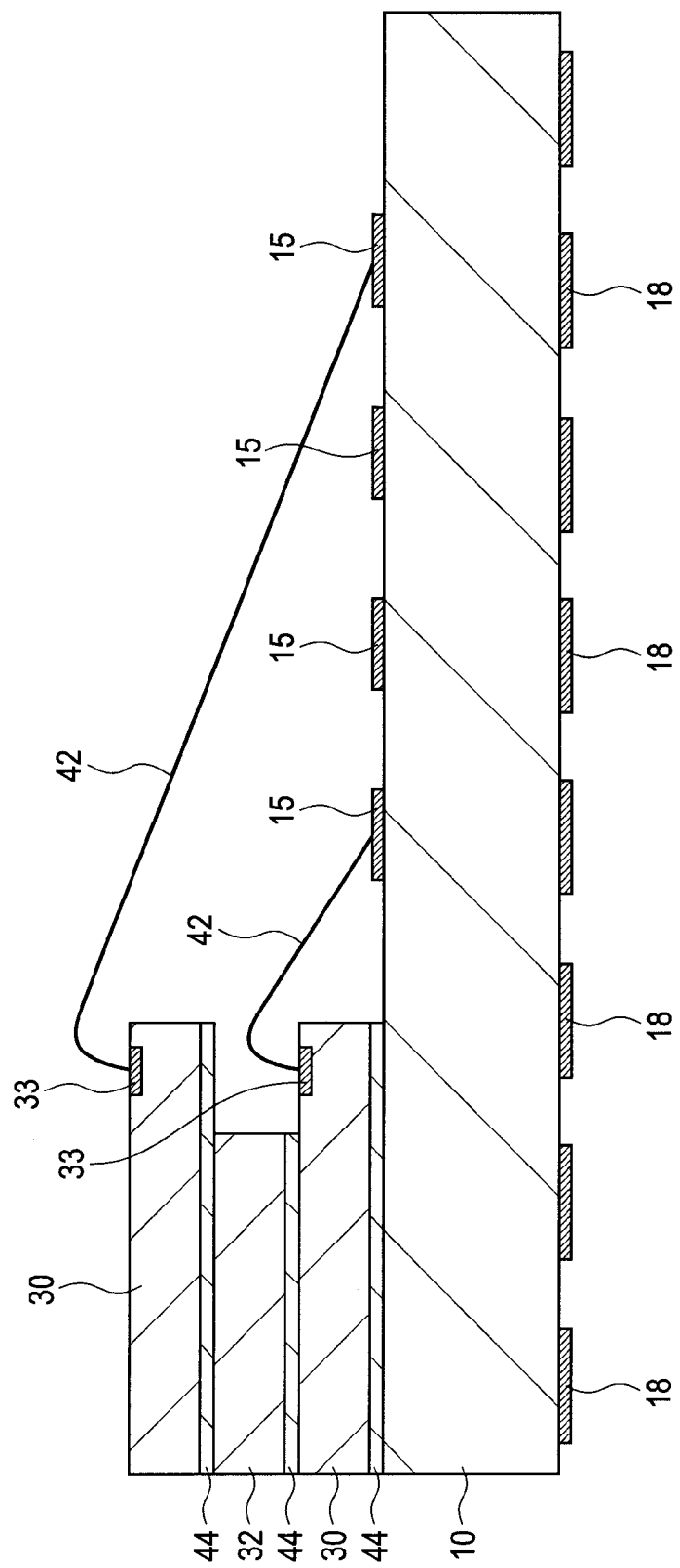
FIG. 21 is an enlarged cross-sectional view of a principal part of the semiconductor device during a manufacturing step following that of FIG. 19.

Next, as shown in FIGS. 20 and 21, with use of the above ball bonding method, the first electrode pad 33 of the memory chip 30 of the second stage (upper layer) and the second conductive pad 15 of the wiring board 10 as well as the second electrode pad 34 and the second conductive pad 15 are electrically connected by using the second wires 42, respectively. In this case also, there is employed what is called a forward bonding method in which one end of the second wire 42 is connected to the electrode pad (the first electrode pad 33, the second electrode pad 34) of the memory chip 30 and, then, the other end of the second wire 42 is connected to the second conductive pad 15 of the wiring board 10.

The wire bonding of the microcomputer chip 20 shown in FIG. 19 may be conducted before the wire bonding of the memory chip 30 of the first stage (lower layer) shown in FIGS. 16 and 17. Alternatively, it may be conducted after the wire bonding of the memory chip 30 of the second stage (upper layer) shown in FIGS. 20 and 21.

Figure 22:
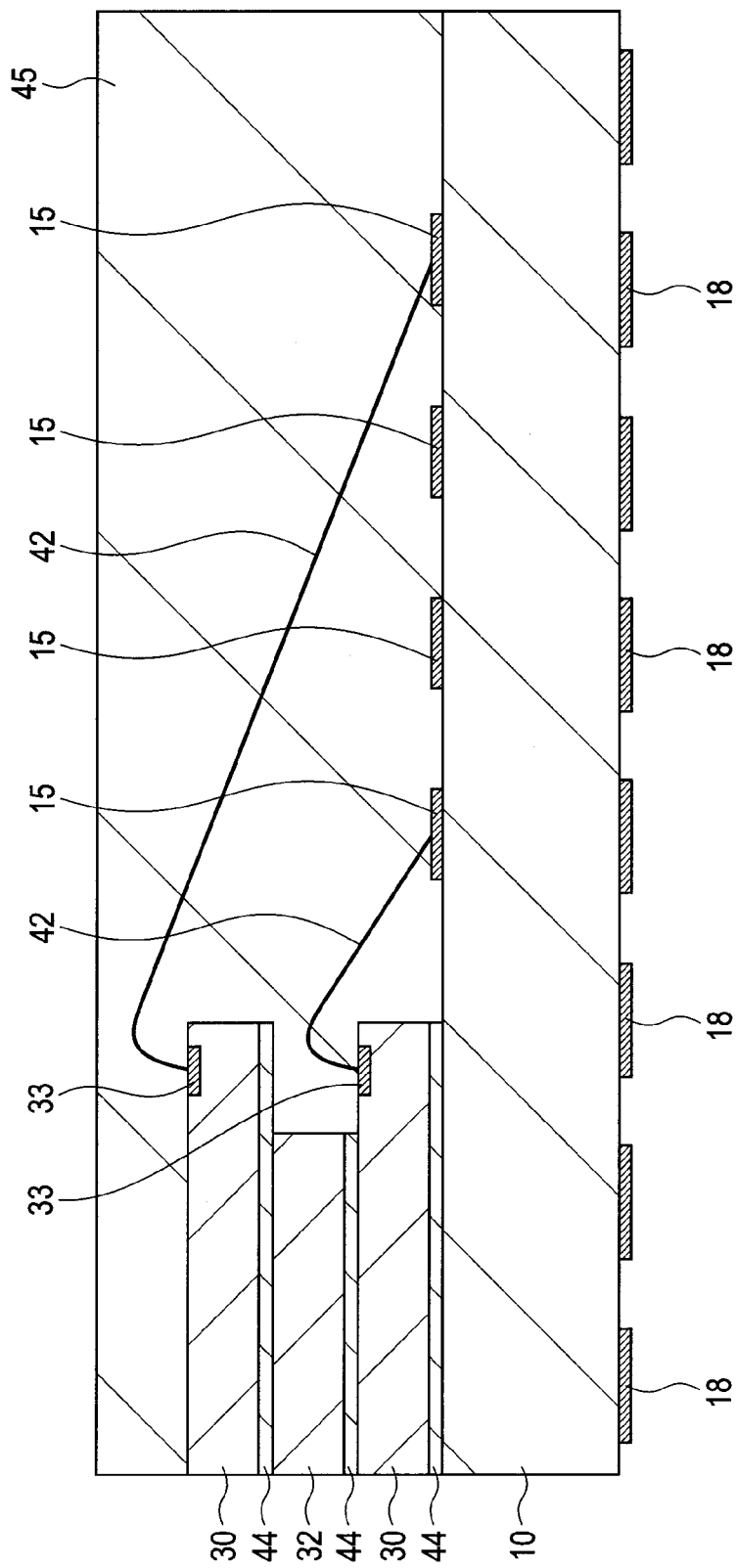
FIG. 22 is an enlarged cross-sectional view of the principal part of the semiconductor device during a manufacturing step following that of FIGS. 20 and 21.
Figure 23:
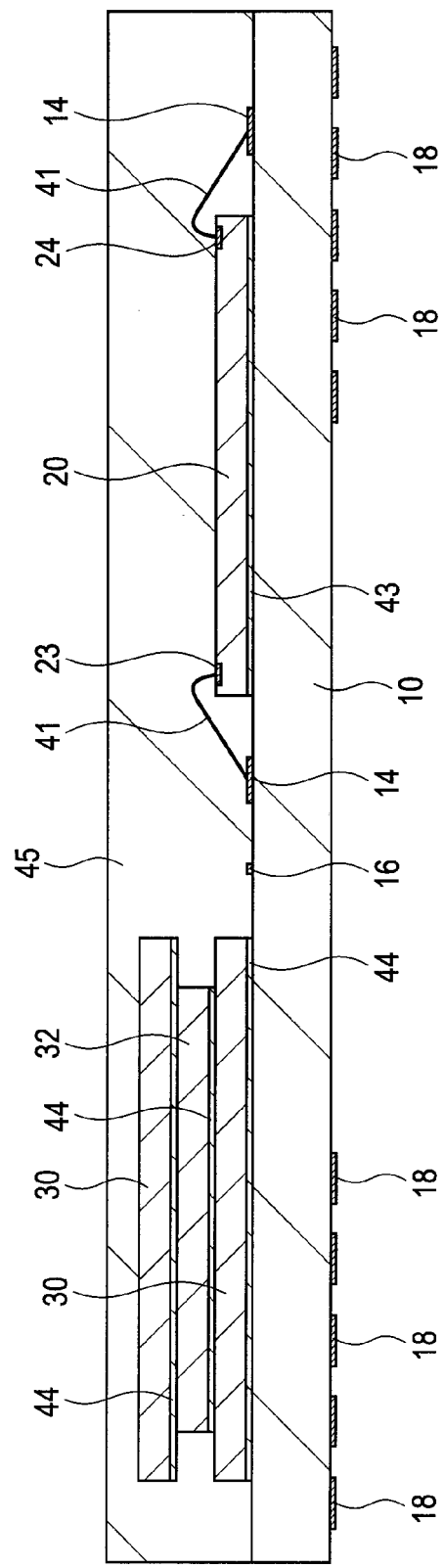
FIG. 23 is a cross-sectional view of the semiconductor device during a manufacturing step following that of FIGS. 20 and 21.

Next, as shown in FIGS. 22 and 23, the microcomputer chip 20, the memory chip 30, and the first wire 41 and the second wire 42 mounted over the upper surface of the wiring board 10 are sealed with a mold resin 45.

Finally, the SIP type semiconductor device shown in FIGS. 1 to 4 is completed by coupling the solder balls 12 to the conductive pads 18 formed over the lower surface of the wiring board 10 and, then, by conducting a marking process in which a product name, etc. are printed on the surface of the mold resin 45 and conducting an electric property inspection process.

Second Embodiment

With the memory chip 30 having a greater storage capacity and the lengths of the sides (the first chip side 31a, the second chip side 31b) along which the electrode pads (the first electrode pad 33, the second electrode pad 34) are formed becoming larger, according to a layout of the first embodiment, the lengths of the third substrate side 11c and the fourth substrate side 11d of the wiring board 10 also become greater, which may cause the larger outer dimensions of the wiring board 10.

Figure 24:
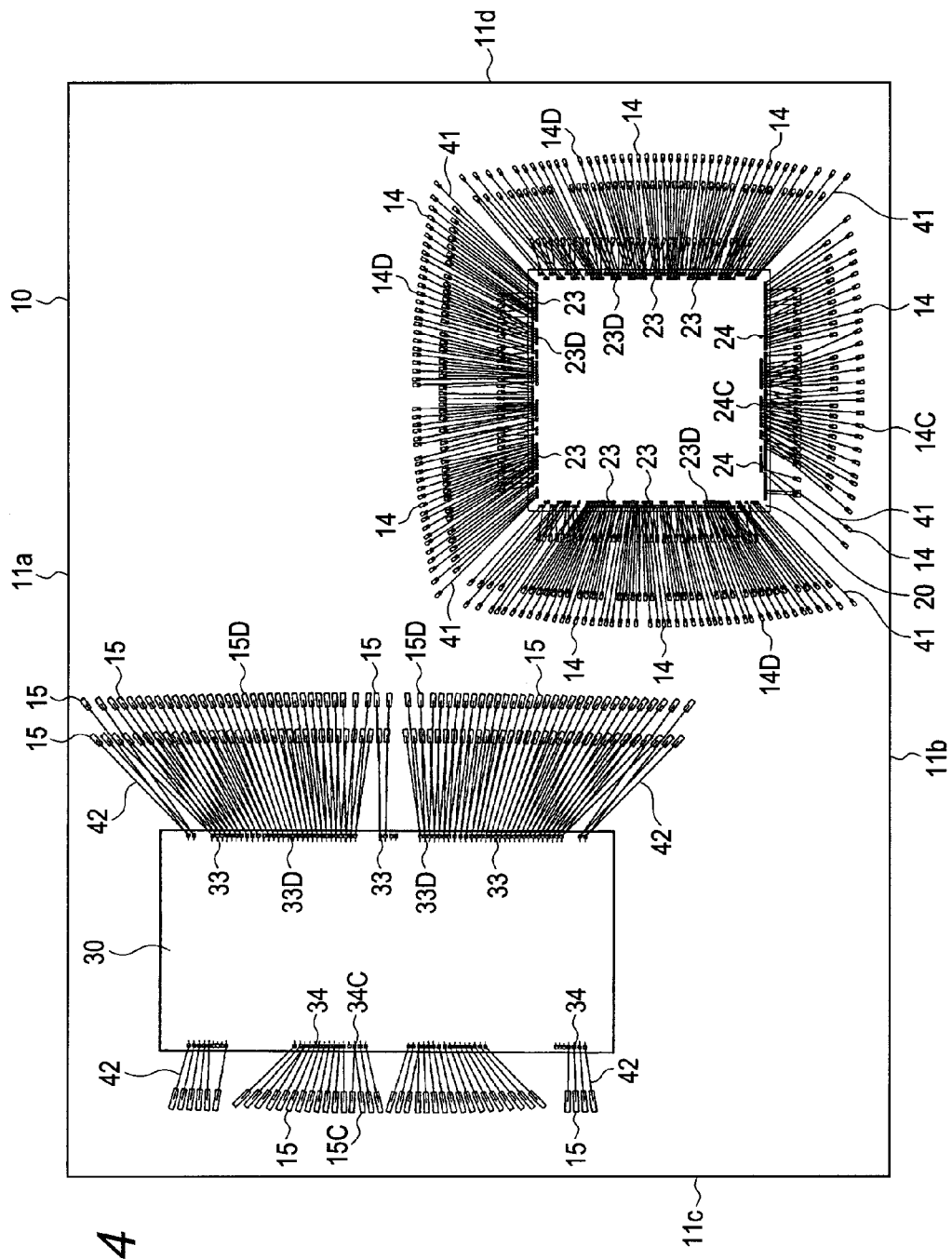
FIG. 24 is an overall plan view of a semiconductor device according to a second embodiment of the invention.

In the above case, as shown in FIG. 24, it is preferred that the memory chip 30 is mounted such that, in the plan view, the second conductive pads 15 arranged along the first chip side 31a of the memory chip 30 are positioned outside the region between an extended line of the third chip side 21c and an extended line of the fourth chip side 21d of the microcomputer chip 20.

In this case also, the memory chip 30 is mounted over the wiring board 10 such that the first chip side 31a along which the data system electrode pads 33D are arranged is positioned closer to the microcomputer chip 20 than the second chip side 31b along which the command/address system electrode pads 34C are arranged. In this way, the length of the data system wiring 16D for coupling the data system electrode pad 23D of the microcomputer chip 20 with the data system electrode pad 33D of the memory chip 30D can be minimized.

While the invention made by the inventors has been specifically described according to the embodiments hereinbefore, the invention is not limited to them, and it will be obvious that the various alteration or modification can be made within a scope without departing from the gist of the invention.

Although the case has been described in the above embodiment where a plurality of memory chips 30 are mounted over the wiring board 10, the present invention can also be applied to a case where one memory chip 30 is mounted over the wiring board 10. However, as described above, the more memory chips 30 there are mounted over the wiring board 10, the more rows for the conductive pads there are required over the wiring board 10, increasing the effect of adopting the present invention.

Thus, the present invention is effectively applicable to a System In Package (SIP) type semiconductor device.

What is claimed is:

1. A semiconductor device comprising:
   (a) a substrate including an upper surface having a first substrate side, a second substrate side facing to the first substrate side, a third substrate side crossing to the first and second substrate sides, and a fourth substrate side facing to the third substrate side, a plurality of first conductive pads formed over the upper surface, a plurality of second conductive pads formed over the upper surface, a plurality of wirings electrically connecting the first conductive pads with the second conductive pads, and a lower surface opposite to the upper surface;
   (b) a microcomputer chip including a microcomputer front surface having a first microcomputer chip side, a second microcomputer chip side facing to the first microcomputer side, a third microcomputer chip side crossing to the first and second microcomputer chip sides, and a fourth microcomputer chip side facing to the third microcomputer chip side, a plurality of first microcomputer electrode pads formed over the microcomputer surface and arranged along the first, third, and fourth microcomputer chip sides, a plurality of second microcomputer electrode pads formed over the microcomputer surface and arranged along the second microcomputer chip side, and a microcomputer back surface opposite to the microcomputer front surface, and mounted on the upper surface of the substrate such that the microcomputer back surface faces to the substrate, and that each of the first and second conductive pads is exposed, and that the first microcomputer chip side is adjacent to the first substrate side, and that the third microcomputer chip side is adjacent to the third substrate side;
   (c) a first memory chip including a first memory front surface having a first memory chip side, a second memory chip side facing to the first memory chip side, a third memory chip side crossing to the first and second memory chip sides, and a fourth memory chip side facing to the third memory chip side, a plurality of first memory electrode pads formed over the first memory surface and arranged along the first memory chip side, a plurality of second memory electrode pads formed over the first memory surface and arranged along the second memory chip side, and a first memory back surface opposite to the first memory surface, and mounting adjacent to the microcomputer chip such that the first memory back surface faces to the substrate, and that each of the first and second conductive pads is exposed, and that the third memory chip side is adjacent to the first substrate side, and that the second memory chip side is adjacent to the third substrate side, and that a spacing between the third memory chip side and the first substrate side is smaller than a spacing between the first microcomputer chip side and the first substrate side, and that a spacing between the second memory chip side and the third substrate side is smaller than a spacing between the third microcomputer ship side and the third substrate side;
   (d) a plurality of first wires electrically connecting the plurality of first and second microcomputer electrode pads with the first conductive pads, respectively; and
   (e) a plurality of second wires electrically connecting the first and second memory electrode pads with the second conductive pads, respectively,
   wherein, in the plan view, the first conductive pads are arranged along the first, second, third, and fourth microcomputer chip sides of the microcomputer chip, respectively,
   wherein, in the plan view, the second conductive pads are arranged along the first and second memory chip sides of the memory chip, respectively,
   wherein each of the first microcomputer electrode pads formed in the microcomputer chip and the first memory electrode pads formed in the first memory chip has a data system electrode pad,
   wherein each of the second microcomputer electrode pads formed in the microcomputer chip and the second memory electrode pads formed in the first memory chip has a command/address system electrode pad,
   wherein the first data system conductive pads of the first conductive pads formed over the substrate electrically connected to the first microcomputer electrode pads of the microcomputer chip via the first wire are arranged along the first, third, and fourth microcomputer chip sides of the microcomputer chip, respectively, and
   wherein the second data system conductive pads of the second conductive pads formed over the substrate electrically connected to the first memory electrode pads of the first memory chip via the second wire are arranged along the first memory chip side of the memory chip.

2. The semiconductor device according to claim 1,
   wherein the substrate has a plurality of wiring layers, and
   wherein a plurality of data system wirings for electrically coupling the first data system conductive pads with the second data system conductive pads, respectively, are formed in a first wiring layer of the wiring layers, which first wiring layer is positioned on the uppermost surface side.

3. The semiconductor device according to claim 2,
   wherein a plurality of first command/address system conductive pads of the first conductive pads formed over the substrate electrically connected to the second microcomputer electrode pads of the microcomputer chip through the first wire are arranged along the second microcomputer chip sides of the microcomputer chip, respectively, and
   wherein a plurality of second command/address system conductive pads of the second conductive pads formed over the substrate electrically connected to the second memory electrode pad of the first memory chip through the second wire are arranged along the second memory chip side of the memory chip.

4. The semiconductor device according to claim 3, wherein a plurality of command/address system wirings for electrically coupling the first command/address system conductive pads with the second command/address system conductive pads, respectively, are formed in a second wiring layer different from the first wiring layer.

5. The semiconductor device according to claim 1, wherein, in the plan view, the first conductive pads are arranged, in a plurality of rows, along the first, second, third, and fourth microcomputer chip sides of the microcomputer chip, respectively.

6. The semiconductor device according to claim 1, wherein, in the plan view, of the second conductive pads, a plurality of second conductive pads arranged along the first memory chip side of the memory chip are arranged in a plurality of rows along the first memory chip side.

7. The semiconductor device according to claim 1, wherein, in the plan view, the second data system conductive pads arranged along the first memory chip side of the memory chip are disposed in a region between an extended line of the third microcomputer chip side of the microcomputer chip and an extended line of the fourth microcomputer chip side.

8. The semiconductor device according to claim 1, wherein each of the first wires on a first bonding side is electrically connected to the first microcomputer electrode pad or the second microcomputer electrode pad of the microcomputer chip, and each of the second wires on the first bonding side is electrically connected to the first memory electrode pad or the second memory electrode pad of the first memory chip.

9. The semiconductor device according to claim 1, wherein the first memory chip is a DDR-SDRAM.

10. The semiconductor device according to claim 1, wherein the first memory chips are mounted in a stacked manner over the upper surface of the substrate.

\* \* \* \* \*